(12) United States Patent
Funyu et al.

(10) Patent No.: US 6,724,675 B2
(45) Date of Patent: Apr. 20, 2004

(54) SEMICONDUCTOR MEMORY DEVICE AND ELECTRONIC APPARATUS

(75) Inventors: Akihiro Funyu, Kawasaki (JP); Shinya Fujioka, Kawasaki (JP); Hitoshi Ikeda, Kawasaki (JP); Takaaki Suzuki, Kawasaki (JP); Masao Taguchi, Kawasaki (JP); Kimiaki Satoh, Kawasaki (JP); Kotoku Sato, Kawasaki (JP); Yasurou Matsuzaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/352,985

(22) Filed: Jan. 29, 2003

(65) Prior Publication Data
US 2003/0115405 A1 Jun. 19, 2003

Related U.S. Application Data

(62) Division of application No. 09/536,988, filed on Mar. 29, 2000, now Pat. No. 6,535,950.

(30) Foreign Application Priority Data

Jun. 10, 1999 (JP) .......................................... 11-163461

(51) Int. Cl.⁷ ................................................ G11C 8/00
(52) U.S. Cl. ........................ 365/222; 365/233; 365/236
(58) Field of Search .................. 365/189.02, 189.05, 365/189.12, 221, 222, 230.02, 230.03, 233, 236; 709/211

(56) References Cited

U.S. PATENT DOCUMENTS

| | | | | |
|---|---|---|---|---|
| 4,145,739 A | * | 3/1979 | Dunning et al. ............. 709/211 |
| 4,639,890 A | * | 1/1987 | Heilveil et al. ......... 365/189.12 |
| 4,660,180 A | | 4/1987 | Tanimura et al. ............ 365/222 |
| 4,691,303 A | | 9/1987 | Churchward et al. ........ 365/222 |
| 4,758,993 A | | 7/1988 | Takemae ..................... 365/222 |
| 5,144,584 A | | 9/1992 | Hoshino ..................... 365/222 |
| 5,289,413 A | * | 2/1994 | Tsuchida et al. ........ 365/189.02 |
| 5,430,684 A | * | 7/1995 | Kim et al. ................... 365/222 |
| 5,432,923 A | | 7/1995 | Taniguchi et al. .............. 711/2 |
| 5,617,367 A | * | 4/1997 | Holland et al. .............. 365/236 |
| 5,659,515 A | | 8/1997 | Matsuo et al. ............... 365/222 |
| 5,675,770 A | | 10/1997 | Ogata ......................... 711/173 |
| 5,796,669 A | | 8/1998 | Araki et al. ................. 365/222 |
| 5,796,671 A | | 8/1998 | Wahlstrom ............. 365/230.03 |
| 5,819,105 A | | 10/1998 | Moriarty et al. ................ 710/5 |
| 5,870,568 A | | 2/1999 | Culley et al. ................ 710/306 |
| 6,023,440 A | * | 2/2000 | Kotani et al. ................ 365/222 |
| 6,347,357 B1 | * | 2/2002 | Sartore et al. ......... 365/189.05 |
| 6,396,744 B1 | | 5/2002 | Wong ..................... 365/185.25 |
| 6,515,914 B2 | * | 2/2003 | Keeth et al. ........... 365/189.05 |

FOREIGN PATENT DOCUMENTS

| | | |
|---|---|---|
| EP | 0 315 991 A | 5/1989 |
| EP | 0 813 154 A1 | 12/1997 |
| GB | 2 265 035 A | 9/1993 |

* cited by examiner

Primary Examiner—Trong Phan
(74) Attorney, Agent, or Firm—Arent, Fox, Kintner, Plotkin & Kahn, PLLC

(57) ABSTRACT

A semiconductor memory device, such as a DRAM, which needs to be refreshed for retaining data, is provided with a storing portion for storing data therein, and a busy signal outputting portion outputting a busy signal during the refresh operation.

15 Claims, 36 Drawing Sheets

FIG. 6A COMMANDS
FIG. 6B Ref1
FIG. 6C BUSY1
FIG. 6D Com
FIG. 6E RASz
FIG. 6F REF
FIG. 6G OUTPUTS OF COUNTER 30

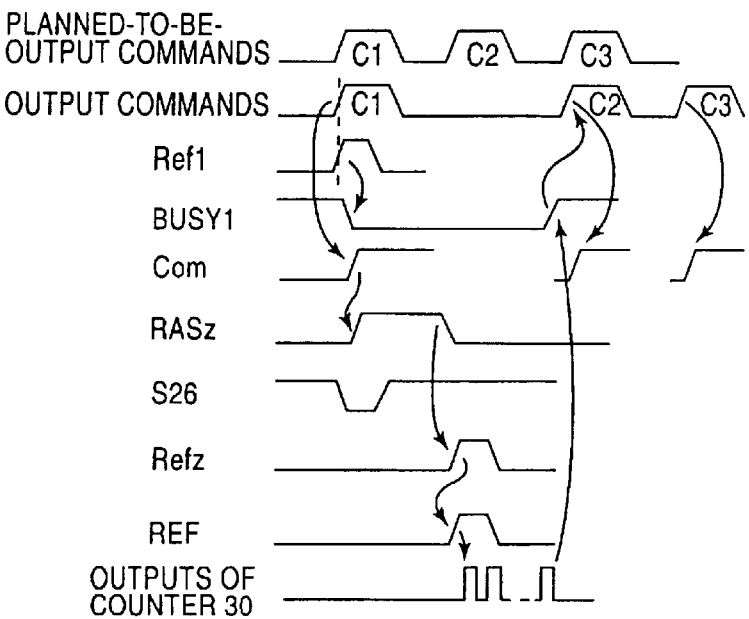# 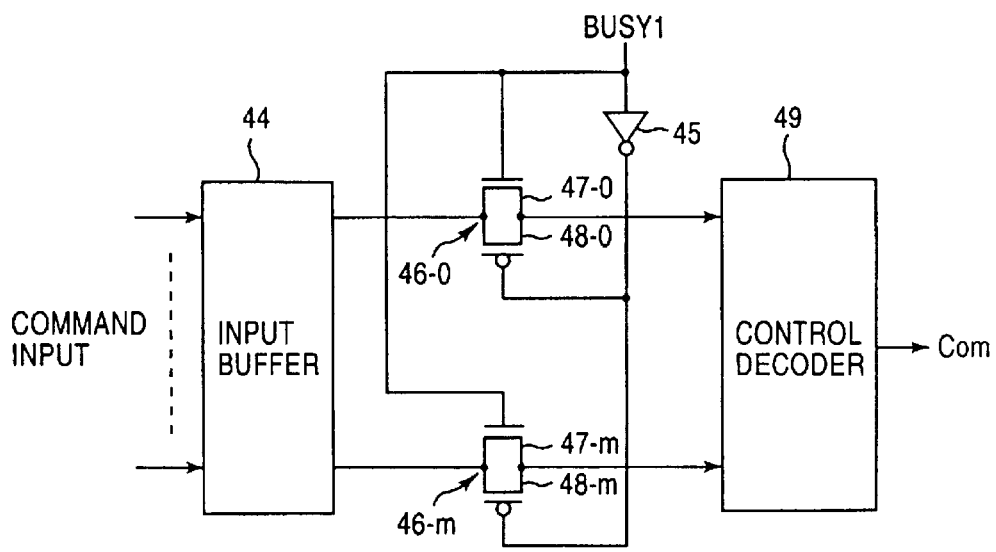

FIG.9
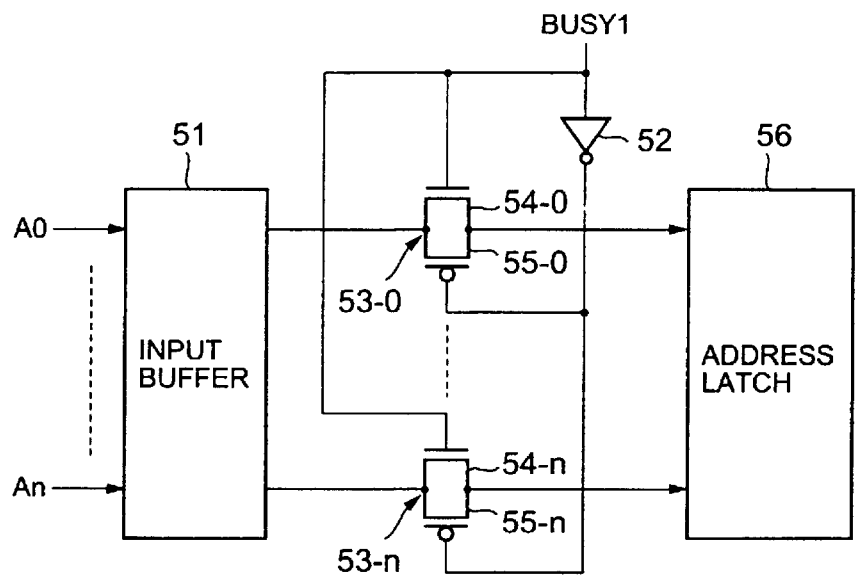
FIG.10A COMMANDS
FIG.10B Ref1
FIG.10C BUSY1
FIG.10D Com

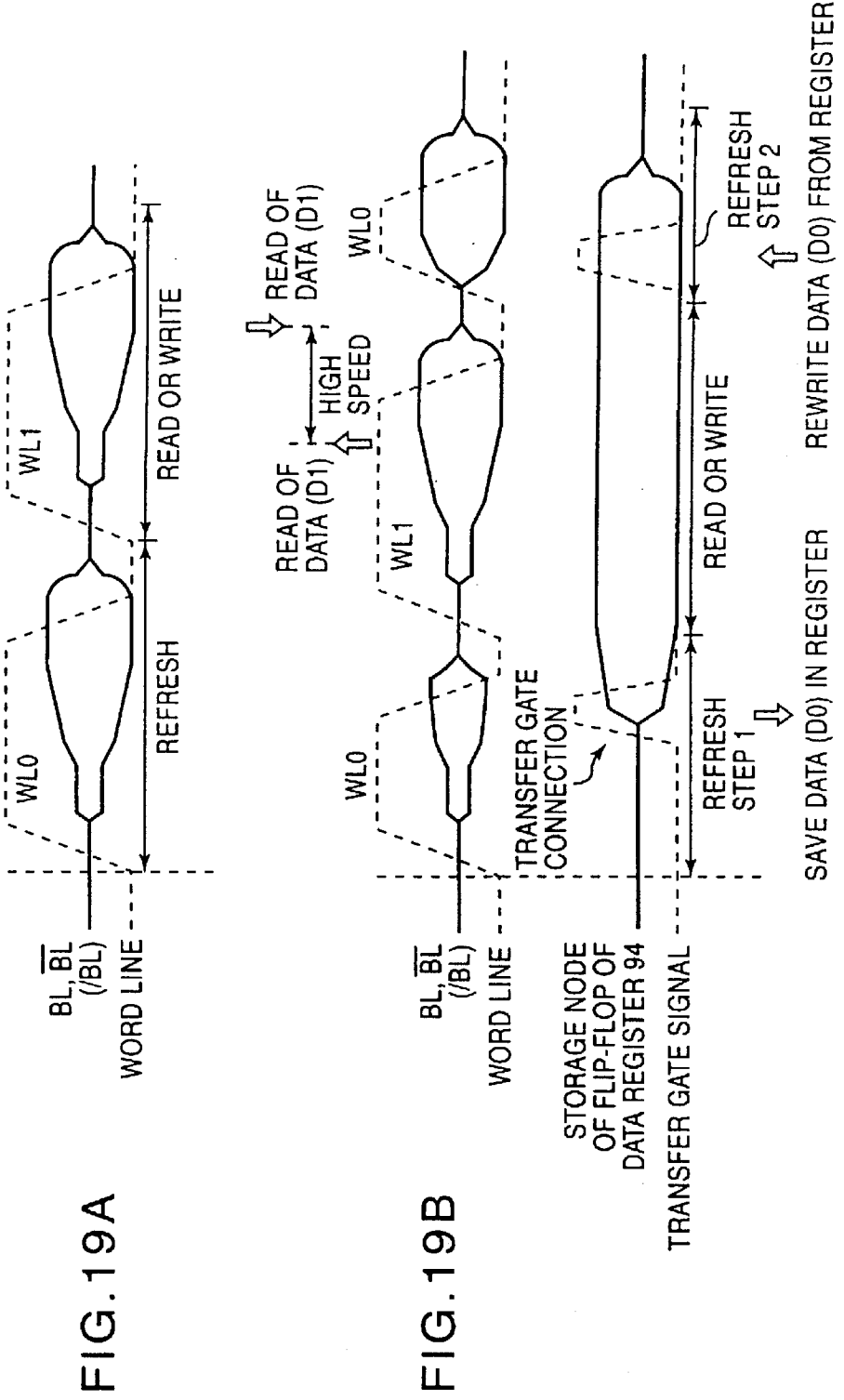

→ TIME

SEMICONDUCTOR MEMORY DEVICE AND ELECTRONIC APPARATUS

This is a Division of Application Ser. No. 09/536,988 filed Mar. 29, 2000 now U.S. Pat. No. 6,535,950. The disclosure of the prior application is hereby incorporated by reference herein in its entirety.

BACKGROUND OF THE INVENTION

1. Field of the Invention

The present invention relates to a semiconductor memory device, such as a DRAM (Dynamic Random Access Memory), which needs to be refreshed for retaining data, an electronic apparatus which uses such a semiconductor memory device, and a semiconductor memory device which is suitable as a semiconductor memory device for saving data therein, for example, used in such an electronic apparatus.

2. Description of the Related Art

For example, although a DRAM has been used as a main storage memory of a personal computer, a server or the like until now, an era in which a large-capacity DRAM is used in a simple terminal such as a cellular phone is coming due to progress of Internet technology, mobile technology and so forth.

Currently, a SRAM (Static Random Access Memory) is mounted in a simple terminal such as a cellular phone. However, when a DRAM is used instead of a SRAM, or a DRAM and a SRAM are used together, it is necessary to consider that the DRAM needs to be refreshed for retaining data, different from the SRAM.

Therefore, it is required that, first, a DRAM mounted in a simple terminal such as a cellular phone be such that control of the DRAM by a controller can be easily performed, and, second, a simple terminal such as a cellular phone is such that, when a main battery goes dead, or is removed, and, thereby, power supply by the main battery is stopped, power consumption of a backup battery due to refresh of the DRAM can be reduced as much as possible.

SUMMARY OF THE INVENTION

The present invention has been devised in consideration of the above-mentioned point, and a first object of the present invention is to provide a semiconductor memory device performing a refresh operation for retaining data, and control of which by a controller is easy. A second object of the present invention is to provide an electronic apparatus which is provided with a semiconductor memory device performing a refresh operation for retaining data and a controller, and, in which control of the semiconductor memory device by the controller is easy. A third object of the present invention is to provide a semiconductor memory device such that saving of data, from another semiconductor memory device, in the semiconductor memory device can be easily performed. A fourth object of the present invention is to provide a semiconductor memory device such that saving of data from the semiconductor memory device is easy.

A semiconductor memory device according to a first aspect of the present invention, performing a refresh operation for retaining data, comprises:

a memory portion for storing data therein; and a busy signal outputting portion outputting a busy signal during the refresh operation.

When the semiconductor memory device according to the first aspect of the present invention is applied to a semiconductor memory device, which performs a refresh operation for retaining data, of an electronic apparatus including the semiconductor memory device and a controller which controls the semiconductor memory device, because the controller can recognize whether or not it is the time for the refresh operation, control of the semiconductor memory device by the controller can be easily performed.

An electronic apparatus according to a second aspect of the present invention comprises:

a semiconductor memory device which performs a refresh operation for retaining data and outputs a busy signal during the refresh operation; and a controller controlling the semiconductor memory device and being able to receive the busy signal.

When the second aspect of the present invention is applied to an electronic apparatus which includes a semiconductor memory device which performs a refresh operation for retaining data and a controller controlling the semiconductor memory device, because the controller can recognize whether or not it is the time for the refresh operation of the semiconductor memory device, control of the semiconductor memory device by the controller can be easily performed.

A semiconductor memory device according to a third aspect of the present invention comprises:

an automatic writing portion which, when automatic writing is externally instructed to be performed, automatically writes data to the device in internally generated addresses; and an automatic writing indicating signal outputting portion which outputs an automatic writing indicating signal, which indicates that automatic writing is being performed, during the automatic writing operation.

According to the third aspect of the present invention, because the automatic writing portion which, when automatic writing is externally instructed to be performed, automatically writes data to the device in internally generated addresses is provided with, saving of the data of a first semiconductor memory device can be easily performed when an electronic apparatus including the first semiconductor memory device and a controller for controlling the first semiconductor memory device is provided with a second semiconductor memory device for saving therein the data stored in the first semiconductor memory device and the third aspect of the present invention is used as the second semiconductor memory device, for example.

A semiconductor memory device according to a fourth aspect of the present invention, comprises an automatic reading portion which comprises:

an address counter which generates an address for automatically reading data from the device when automatic reading is externally instructed to be performed; and an access-accepting allowing/rejecting signal receiving portion which receives an access-accepting allowing/rejecting signal output from a data transfer destination and indicating whether or not the destination agrees to accept access, wherein the automatic reading portion automatically reads data from the device when automatic reading is externally instructed to be performed and the access-accepting allowing/rejecting signal indicates that the destination agrees to accept access.

According to the fourth aspect of the present invention, because the automatic reading portion which automatically reads data from the device when automatic reading is externally instructed to be performed and the access-accepting allowing/rejecting signal indicates that the data transfer destination agrees to accept access is provided with, it is possible to easily transfer data to (save data in) the data transfer destination (data saving destination), which outputs the access-accepting allowing/rejecting signal, when it is necessary to transfer the data (it is necessary to save the data, for example).

Other objects and further features of the present invention will become more apparent from the following detailed description when read in conjunction with the accompanying drawings.

BRIEF DESCRIPTION OF THE DRAWINGS

FIGS. 6A through 6G show waveforms illustrating a first example of operations of a refresh control circuit, a BUSY1 outputting circuit and a refresh counter shown in FIG. 3;

FIGS. 7A through 7J show waveforms illustrating a second example of operations of the refresh control circuit, BUSY1 outputting circuit and refresh counter shown in FIG. 3;

FIG. 8 is a circuit diagram showing an arrangement of a command decoder shown in FIG. 3;

FIG. 9 is a circuit diagram showing an arrangement of an address inputting circuit shown in FIG. 3;

FIGS. 10A through 10D show waveforms illustrating an example of operations of a controller shown in FIG. 1;

FIGS. 19A and 19B show waveforms for comparing a first example of operations of the third embodiment of the semiconductor memory device according to the present invention with an example of operations of a DRAM in the related art;

DETAILED DESCRIPTION OF THE PREFERRED EMBODIMENTS

Making reference to FIGS. 1 through 45, first through eighth embodiments of a semiconductor memory device according to the present invention and first through sixth embodiments of an electronic apparatus according to the present invention will now be described.

Figure 1:
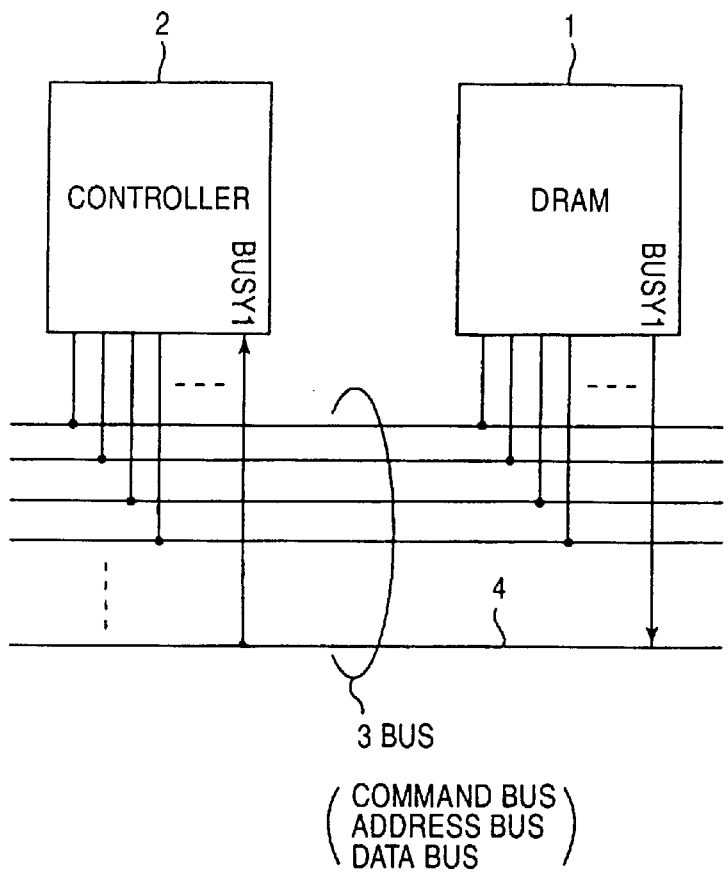
FIG. 1 is a circuit diagram showing an essential portion of a first embodiment of an electronic apparatus according to the present invention.

FIG. 1 is a circuit diagram showing an essential portion of a first embodiment of an electronic apparatus according to the present invention. As shown in the figure, this electronic apparatus includes a DRAM 1, a controller 2 which controls the DRAM 1, and buses such a command bus, an address bus, a data bus and so forth.

The DRAM 1 is configured to self-manage refresh of itself, and, when the time for refreshing itself comes, outputs a busy signal BUSY1 to a BUSY1 signal line 4, generates a refresh address through an internal circuit thereof, performs the refresh thereof, and, when finishing the refresh, negates the busy signal BUSY1.

The controller 2 is configured to be able to receive the busy signal BUSY1 output to the BUSY1 signal line 4 by the DRAM 1, and, when receiving the busy signal BUSY1, stop accessing the DRAM 1 until the busy signal BUSY1 is negated, for example.

Through the specification of the present application, to output the busy signal BUSY1 means to cause the busy signal BUSY1 to have an L level, and, to negate the busy signal BUSY1 means to cause the busy signal BUSY1 to have an H level.

Figure 2A:
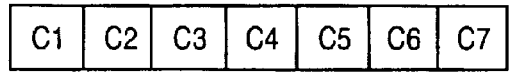
FIGS. 2A, 2B and 2C are time charts showing an examination of operations of a DRAM and a controller shown in FIG. 1.
Figure 2B:
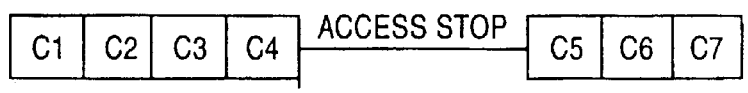
Figure 2C:
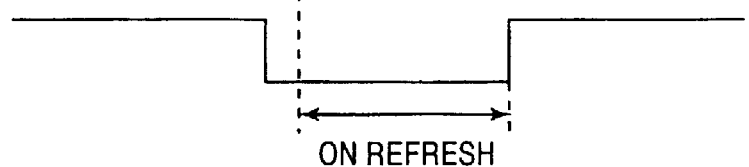

FIGS. 2A, 2B and 2C are time charts showing an example of operations of the DRAM 1 and controller 2. FIG. 2A shows commands planned to be output from the controller 2, FIG. 2B shows commands actually output from the controller 2, and FIG. 2C shows the busy signal BUSY1 output from the DRAM 1.

That is, this example shows a case where, in a case where the controller 2 plans to output commands C1 through C7 successively, the commands C1 through C4 are actually output, and the busy signal BUSY1 is output from the DRAM 1 when the command C4 is being output.

In this case, because the DRAM 1 has already input the command C4 thereto when outputting the busy signal BUSY1, the DRAM 1 operates so as to perform refresh thereof after executing the command C4, and negate the busy signal BUSY1 when finishing the refresh.

On the other hand, when receiving the busy signal BUSY1, the controller 2 stops outputting the commands C5 and the subsequent ones, stops accessing the DRAM 1, and, when the busy signal BUSY1 is negated, the controller 2 outputs the commands C5 and the subsequent ones successively, and restarts accessing the DRAM 1.

Thus, in the first embodiment of the electronic apparatus according to the present invention, the DRAM 1 is configured to self-manage refresh of itself, outputs the busy signal BUSY1 to the BUSY1 signal line 4 when the time for refreshing itself comes, and, also, to generate a refresh address through the internal circuit thereof and performs the refresh thereof. Accordingly, the controller 2 does not need to manage refresh of the DRAM 1.

Further, it is possible for the controller 2 to recognize that the time for the refresh of the DRAM 1 is occurring, as a result of receiving the busy signal BUSY1, and to stop accessing the DRAM 1. Accordingly, control of accessing the DRAM 1 by the controller 2 is easy.

Accordingly, when the first embodiment of the electronic apparatus according to the present invention is applied to a simple terminal such as a cellular phone, and a DRAM which needs to be refreshed is mounted in a simple terminal such as a cellular phone, control of the DRAM by a controller can be easily performed.

Figure 3:
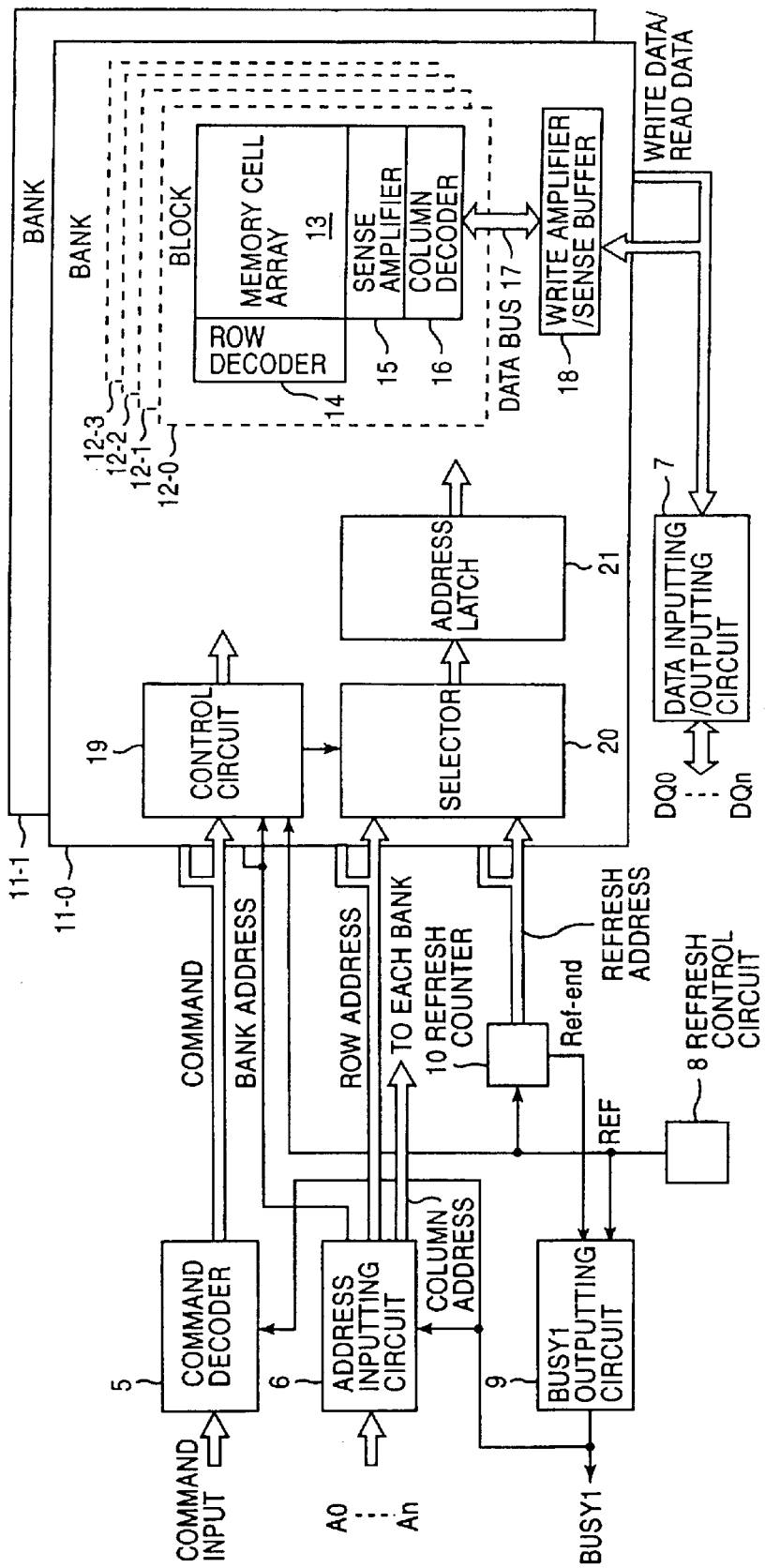
FIG. 3 is circuit diagram of an essential portion of a first embodiment of a semiconductor memory device according to the present invention.

FIG. 3 is circuit diagram of an essential portion of a first embodiment of a semiconductor memory device according to the present invention. The first embodiment of the semiconductor memory device according to the present invention can be used as the DRAM 1 shown in FIG. 1.

As shown in FIG. 3, the semiconductor memory device includes a command decoder 5 which inputs command signals from a controller thereto and decodes them, an address inputting circuit 6 which inputs address signals A0 through An thereto, holds and outputs them, and a data inputting/outputting circuit 7 performing inputting/outputting of write data/read data DQ0 through DQn.

The semiconductor memory device further includes a refresh control circuit 8 which controls the refresh of the semiconductor memory device, a BUSY1 outputting circuit 9 which is controlled by the refresh control circuit 8 and outputs the busy signal BUSY1, a refresh counter 10 which is controlled by the refresh control circuit 8 and outputs the refresh address.

The semiconductor memory device further includes memory areas 11-0 and 11-1 called banks to be selected by a bank address signal. The circuit arrangement of the bank 11-0 is the same as that of the bank 11-1. The bank 11-0 includes memory areas 12-0 through 12-3 called blocks.

The blocks 12-0 through 12-3 each has the same circuit arrangement. The block 12-0 includes a memory cell array 13 in which memory cells are arranged, a row decoder 14 which decodes row address signals and selects a word line, a sense amplifier 15 which amplifies data read from the memory cell array 13, and a column decoder 16 which decodes column address signals and selects a column.

The bank 11-0 further includes a data bus 17 which is used by the blocks 12-0 through 12-3 in common, write amplifier/sense buffer 18 which is provided for the blocks 12-0 through 12-3 in common, and a control circuit 19 which controls the bank 11-0.

The bank 11-0 further includes a selector 20 which is controlled by the control circuit 19 and selects the row address signals output from the address inputting circuit 6 at the time of reading/writing of data, and selects the refresh address output from the refresh counter 10 at the time of the refresh of the semiconductor memory device, and an address latch circuit 21 which holds and outputs the address signals output from the selector 20.

Figure 4:
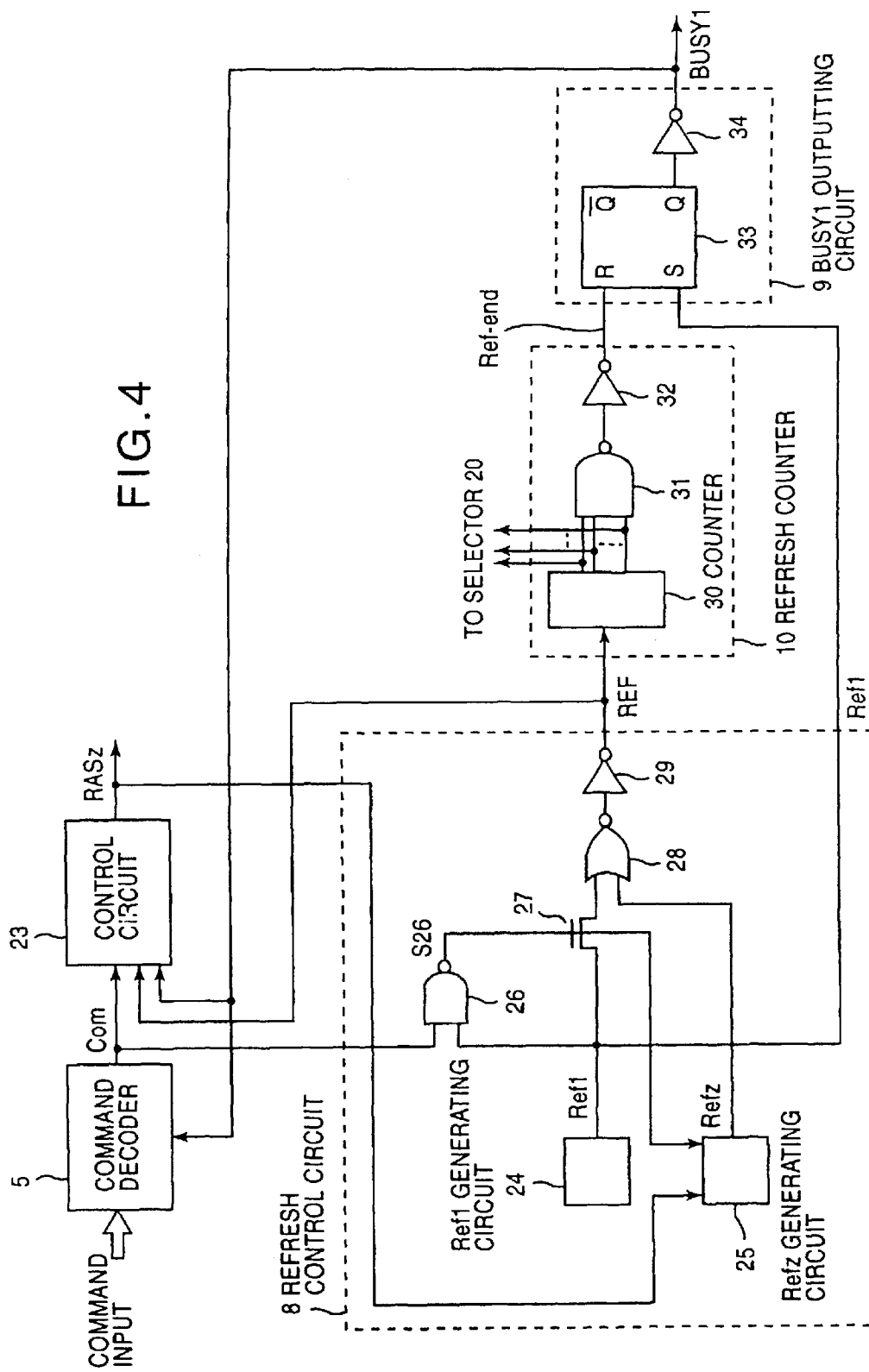
FIG. 4 is a circuit diagram showing arrangements of a refresh control circuit, a BUSY1 outputting circuit and a refresh counter shown in FIG. 3.

FIG. 4 is a circuit diagram showing arrangements of the refresh control circuit 8, BUSY1 outputting circuit 9 and refresh counter 10. An internal command signal Com is obtained as a result of external command signals being decoded. A control circuit 23 is included in the bank 11-1 and outputs a RAS activating signal RASz. In the first embodiment of the semiconductor memory device according to the present invention, the refresh is performed for each row address in the order of the banks 11-0, 11-1 alternately.

Further, the refresh control circuit 8 includes a Ref1 generating circuit which generates a refresh control signal Ref1 which informs of the time for the refresh of the semiconductor memory device periodically. Alternatively, management of the time for the refresh of the semiconductor memory device may be performed as a result of an oscillator being mounted in the first embodiment of the semiconductor memory device according to the present invention and the time being measured using the output of the oscillator. Further alternatively, management of the time for the refresh of the semiconductor memory device may be performed as a result of the time being measured using a clock signal from a crystal oscillator or the like provided in an electronic apparatus which uses the first embodiment of the semiconductor memory device according to the present invention.

The refresh control circuit 8 further includes a Refz generating circuit 25 which generates a refresh control signal Refz for delaying commencement of the operation of the refresh counter 10 until a command is executed, for giving priority to execution of the command, when outputting of the busy signal BUSY1 and outputting of the command from the controller are performed simultaneously.

The refresh control circuit 8 further includes a NAND circuit 26 which processes, in accordance with the NAND manner, the internal command signal Com output from the command decoder 5 and the refresh control signal Ref1, and a NMOS transistor 27, turning on, off of which is controlled by the output S26 of the NAND circuit 26.

The refresh control circuit 8 further includes a NOR circuit 28 which processes, in accordance with the NOR manner, the refresh control signal Ref1 provided via the NMOS transistor 27 and the refresh control signal Refz, and an inverter 29 which inverts the output of the NOR circuit 28 and outputs a refresh control signal REF.

The refresh counter 10 includes a counter 30 which starts a counting operation using the refresh control signal REF as a trigger signal and outputs the refresh address, and a NAND circuit 31 which processes, in accordance with the NAND manner, the outputs of the counter 30, and an inverter 32 which inverts the output of the NAND circuit 31 and outputs a refresh ending signal Ref-end which informs of the end of the refresh.

The BUSY1 outputting circuit 9 includes a RS flip-flop circuit 33 inputs thereto the refresh control signal Ref1 as a setting signal and the refresh ending signal Ref-end as a resetting signal, and an inverter 34 which inverts the positive-phase output Q of RS flip-flop circuit 33 and outputs the busy signal BUSY1.

Figure 5:
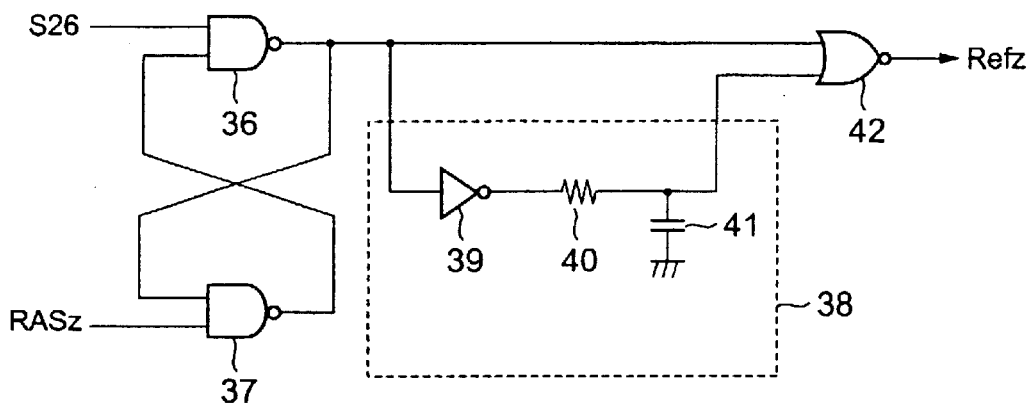
FIG. 5 is a circuit diagram showing an arrangement of a Refz generating circuit shown in FIG. 4.

FIG. 5 is a circuit diagram showing an arrangement of the Refz generating circuit 25. The Refz generating circuit 25 includes NAND circuits 36 and 37 which form a flip-flop circuit, and an inverting and delaying circuit 38 which inverts and delays the output of the NAND circuit 36. The inverting and delaying circuit 38 includes an inverter 39, a resistor 40 and a capacitor 41. The Refz generating circuit 25 further includes a NOR circuit 42 which processes, in accordance with the NOR manner, the output of the NAND circuit 36 and the output of the inverting and delaying circuit 38, and outputs the refresh control signal Refz.

FIGS. 6A through 6G show waveforms illustrating a first example of operations of the refresh control circuit 8, BUSY1 outputting circuit 9 and refresh counter 10. FIG. 6A shows commands output from the controller, FIG. 6B shows the refresh control signal Ref1, FIG. 6C shows the busy signal BUSY1, FIG. 6D shows the internal command signal Com, FIG. 6E shows the RAS activating signal RASz, FIG. 6F shows the refresh control signal REF and FIG. 6G shows the outputs of the counter 30.

FIGS. 6A through 6G show a case where the refresh control signal Ref1 is output from the Ref1 generating circuit 24 (the refresh control signal Ref1 is caused to have the H level) when no commands are output from the controller.

In this case, first, the reset RS flip-flop circuit 33 is set by the refresh control signal Ref1, the positive-phase output Q of the RS flip-flop circuit 33 comes to have the H level, and the busy signal BUSY1 is output (the busy signal BUSY1 comes to have the L level).

Further in this case, the internal command signal Com has the L level, the output S26 of the NAND circuit 26 has the H level, the NMOS transistor 27 is turned on, and, also, the RAS activating signal RASz has the L level. In the Refz generating circuit 25, the output of the NAND circuit 37 has the H level, the output of the NAND circuit 36 has the L level, the output of the inverting and delaying circuit 38 has the H level, and the refresh control signal Refz has the L level.

As a result, the refresh control signal Ref1 output from the Ref1 generating circuit 24 is provided to the NOR circuit 28 via the NMOS transistor 27. However, because the NOR circuit 28 functions as an inverter for the refresh control signal Ref1, the refresh control signal Ref1 is output as the refresh control signal REF, and the counter 30 is started.

That is, in the case where the refresh control signal Ref1 is output from the Ref1 generating circuit 24 when no commands are output from the controller, the refresh address is output from the counter 30 immediately after the busy signal BUSY1 is caused to have the L level, and the refresh of the semiconductor memory device is performed.

Then, after all the refresh addresses are output and all of the outputs of the counter 30 come to have the H level, the output of the NAND circuit 31 comes to have the L level, the refresh ending signal Ref-end comes to have the H level, the RS flip-flop circuit 33 is reset, the positive-phase output Q of the RS flip-flop circuit 33 comes to have the L level, the busy signal BUSY1 comes to have the H level, and, thus, the busy signal BUSY1 is negated.

FIGS. 7A through 7J show waveforms illustrating a second example of operations of the refresh control circuit 8, BUSY1 outputting circuit 9 and refresh counter 10. FIG. 7A shows commands planned to be output from the controller, FIG. 7B shows the commands actually output from the controller, FIG. 7C shows the refresh control signal Ref1, FIG. 7D shows the busy signal BUSY1, FIG. 7E shows the internal command signal Com, FIG. 7F shows the RAS activating signal RASz, FIG. 7G shows the output S26 of the NAND circuit 26, FIG. 7H shows the refresh control signal Refz, FIG. 7I shows the refresh control signal REF and FIG. 7J shows the outputs of the counter 30.

FIGS. 7A through 7J show a case where inputting of the command from the controller and outputting of the refresh control signal Ref1 are performed simultaneously. Specifically, in the case where the commands C1, C2 and C3 are planned to be output successively from the controller, inputting of the command C1 and outputting of the refresh control signal Ref1 are performed simultaneously.

In this case, first, the reset RS flip-flop circuit 33 is set by the refresh control signal Ref1, the positive-phase output Q of the RS flip-flop circuit 33 comes to have the H level, and the busy signal BUSY1 is output (the busy signal BUSY1 comes to have the L level).

Further in this case, the internal command signal Com comes to have the H level, the output of the NAND circuit 26 comes to have the L level, and the NMOS transistor 27 is turned off. Thereby, the refresh control signal Ref1 is not provided to the NOR circuit 28.

Then, when the refresh control signal Ref1 comes to have the L level, the output of the NAND circuit 26 come to have the H level, the NMOS transistor 27 is turned on, and the NOR circuit 28 functions as an inverter for the refresh control signal Refz. In this case, the refresh control signal Refz is output as the refresh control signal REF.

Further, as a result of the internal command signal Com coming to have the H level and the output S26 of the NAND circuit 26 coming to have the L level, the output of the NAND circuit 36 comes to have the H level, the refresh control signal Refz come to have the L level, then, the output of the inverting and delaying circuit 38 comes to have the H level, and the L level of the refresh control signal Refz is maintained, in the Refz generating circuit 25.

Further, as a result of the internal command signal Com coming to have the H level, the RAS activating signal RASz comes to have the H level. However, when execution of the command C1 is finished, the RAS activating signal RASz come to have the L level. As a result, the output of the NAND circuit 37 comes to have the H level, the output of the NAND circuit 36 comes to have the L level, the refresh control signal Refz come to have the H level, then, the output of the inverting and delaying circuit 38 comes to have the H level, and, thereby, the refresh control signal Refz comes to have the L level, in the Refz generating circuit 25.

Accordingly, when the inputting of the command C1 and outputting of the refresh control signal Ref1 are performed simultaneously, the busy signal BUSY1 comes to have the L level. However, the refresh addresses are output from the counter 30 after execution of the command C1 is finished, and the refresh is performed.

Then, after all the refresh addresses are output and all of the outputs of the counter 30 come to have the H level, the output of the NAND circuit 31 comes to have the L level, the refresh ending signal Ref-end comes to have the H level, the RS flip-flop circuit 33 is reset by the refresh ending signal Ref-end, the positive-phase output Q of the RS flip-flop circuit 33 comes to have the L level, the busy signal BUSY1 comes to have the H level, and, thus, the busy signal BUSY1 is negated.

Thus, in the first embodiment of the semiconductor memory device according to the present invention, when the inputting of a command from the controller and outputting of the refresh control signal Ref1 are being performed simultaneously, priority is given to execution of the command, and the refresh of the semiconductor memory device is performed after the command is executed.

FIG. 8 is a circuit diagram showing an arrangement of the command decoder 5. As shown in the figure, the command decoder 5 includes an input buffer 44 which causes the command signals from the controller to undergo buffering, and an inverter 45 which inverts the busy signal BUSY1.

The command decoder 5 further includes transmission gates 46-0, . . . , 46-$m$ which control transmission of a command output from the input buffer 44. The transmission gates 46-0, . . . , 46-$m$ include NMOS transistors 47-0, . . . , 47-$m$, turning on, off thereof being controlled by the busy signal BUSY1, and PMOS transistors 48-0, . . . , 48-$m$, turning on, off thereof being controlled by the output of the inverter 45. The transmission gates 46-1, . . . , 46-($m$−1) provided between the transmission gates 46-0 and 46-$m$ are not shown in the figure.

The transmission gates 46-0, . . . , 46-$m$ are turned on when the busy signal BUSY1 has the H level, and are turned off when the busy signal BUSY1 has the L level. Thereby, when a command is output from the controller during the time for the refresh of the semiconductor memory device, the command signals are not brought in.

The command decoder 5 further includes a control decoder 49 which decodes the command signals provided via the transmission gates 46-0, . . . , 46-$m$ from the input buffer 44, and outputs the internal command signal Com.

FIG. 9 is a circuit diagram showing an arrangement of the address inputting circuit 6. As shown in the figure, the address inputting circuit 6 includes an input buffer 51 which causes the address signals A0 through An from the controller to undergo buffering, and an inverter 52 which inverts the busy signal BUSY1.

The address inputting circuit 6 further includes transmission gates 53-0, . . . , 53-$n$ which control transmission of the address signals A0 through An output from the input buffer 51. The transmission gates 53-0, . . . , 53-$n$ include NMOS transistors 54-0, . . . , 54-$n$, turning on, off thereof being controlled by the busy signal BUSY1, and PMOS transistors 55-0, . . . , 55-$n$, turning on, off thereof being controlled by the output of the inverter 52. The transmission gates 53-1, . . . , 53-($n$−1) provided between the transmission gates 53-0 and 53-$n$ are not shown in the figure.

The transmission gate 53-0, . . . , 53-$n$ are turned on when the busy signal BUSY1 has the H level, and are turned off when the busy signal BUSY1 has the L level. Thereby, when the address signals A0 through An are output from the controller during the time for the refresh of the semiconductor memory device, the address signals A0 through An are not brought in. The address inputting circuit 6 further includes an address latch circuit 56 which holds and outputs the address signals A0 through An provided via the transmission gates 53-0, . . . , 53-$n$ from the input buffer 51.

Thus, in the first embodiment of the semiconductor memory device according to the present invention, the refresh of the semiconductor memory device is managed by the refresh control circuit 8. Then, when the time for the refresh of the semiconductor memory device comes and there is no command which is being processed, the refresh of the semiconductor memory device can be performed based on the refresh address output from the refresh counter 10 immediately. When the time for the refresh of the semiconductor memory device comes but there is a command which is being processed, the refresh of the semiconductor memory device can be performed based on the refresh address output from the refresh counter 10 after the command is executed. Accordingly, the controller does not need to manage the refresh of the semiconductor memory device.

Further, in the first embodiment of the semiconductor memory device according to the present invention, the busy signal BUSY1 is output from the BUSY1 outputting circuit 9 when the time for the refresh of the semiconductor memory device comes. Therefore, the controller can recognize that the time for the refresh of the semiconductor memory device comes, as a result of receiving the busy signal BUSY1. Accordingly, control of access to the semiconductor memory device by the controller is easy.

Further, in the first embodiment of the semiconductor memory device according to the present invention, when inputting of a command from the controller and outputting of the busy signal BUSY1 are performed simultaneously, execution of the command is given priority. Accordingly, when inputting of a command from the controller and outputting of the busy signal BUSY1 are performed simultaneously, the controller does not need to output the same command again. Accordingly, also in this sense, control of access to the semiconductor memory device by the controller is easy.

In the first embodiment of the semiconductor memory device according to the present invention, the command decoder 5 is controlled so as not to bring any command in, and the address inputting circuit 6 is controlled so as not to bring any address signals in, while the busy signal BUSY1 is being output. Therefore, the controller may output the same command repeatedly which is not brought in by the semiconductor memory device, while the busy signal BUSY1 is being output, as shown in FIGS. 10A through 10D. FIG. 10A shows a command output from the controller, FIG. 10B shows the refresh control signal Ref1, FIG. 10C shows the busy signal BUSY1 and FIG. 10D shows the internal command signal Com.

Figure 11:
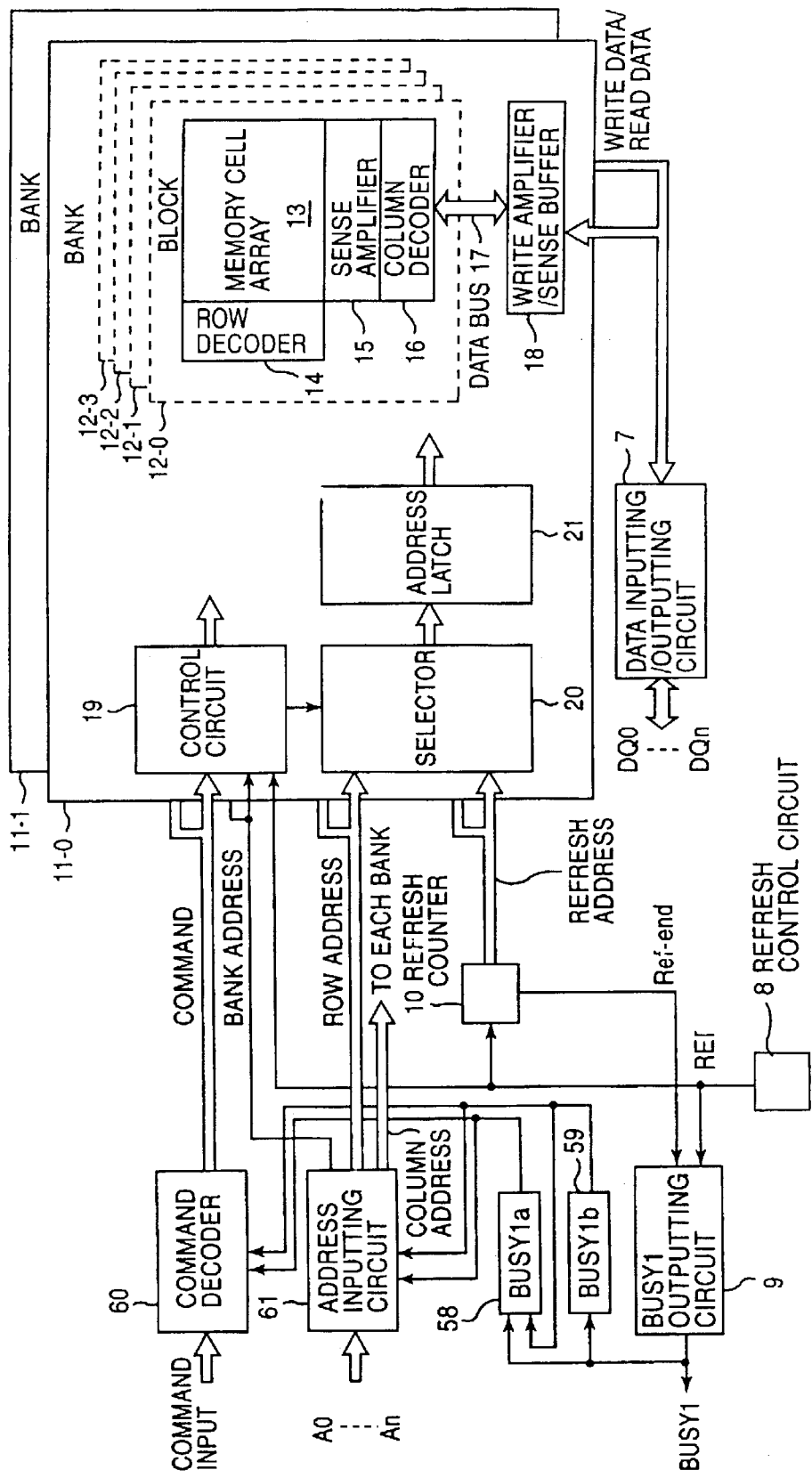
FIG. 11 is a circuit diagram showing an essential portion of a second embodiment of a semiconductor memory device according to the present invention.

FIG. 11 is a circuit diagram showing an essential portion of a second embodiment of a semiconductor memory device according to the present invention. The second embodiment of the semiconductor memory device according to the present invention can also be used as the DRAM 1 shown in FIG. 1.

The second embodiment of the semiconductor memory device according to the present invention includes a BUSY1a generating circuit 58 and a BUSY1b generating circuit 59 shown in FIG. 11, which are not included in the first embodiment of the semiconductor memory device according to the present invention shown in FIG. 3, and includes a command decoder 60 and an address inputting circuit 61, the circuit arrangements of which are different from those of the command decoder 5 and address inputting circuit 6 included in the first embodiment of the semiconductor memory device according to the present invention shown in FIG. 3. Except for those points, The second embodiment of the semiconductor memory device according to the present invention has the same arrangement as that of the first embodiment of the semiconductor memory device according to the present invention shown in FIG. 3.

The BUSY1b generating circuit 59 inputs the busy signal BUSY1 thereto, and outputs a busy signal BUSY1b. As shown in FIG. 14E, the level of the busy signal BUSY1b changed from the H level to the L level when the level of the busy signal BUSY1 changes from the L level to the H level, and, after a fixed time period elapses, the level of the busy signal BUSY1b changes to the H level.

The BUSY1a generating circuit 58 inputs the busy signals BUSY1 and BUSY1b thereto, and outputs a busy signal BUSY1a. As shown in FIG. 14D, when the level of the busy signal BUSY1 changes from the H level to the L level, the level of the busy signal BUSY1a changes from the H level to the L level, and, then, when the level of the busy signal BUSY1b changes from the L level to the H level, the level of the busy signal BUSY1a changes from the L level to the H level.

Figure 12:
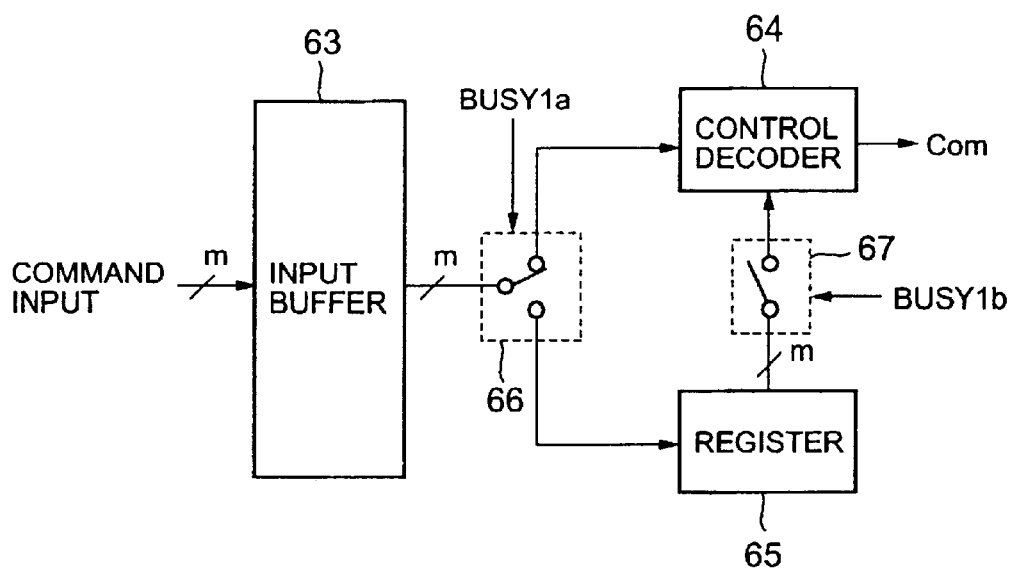
FIG. 12 is a circuit diagram showing an arrangement of a command decoder shown in FIG. 11.

FIG. 12 is a circuit diagram showing an arrangement of the command decoder 60. As shown in the figure, the command decoder 60 includes an input buffer 63 which causes command signals from the controller to undergo buffering, control decoder 64 which decodes the command signals output from the input buffer 63 and outputs the internal command signal Com, and a register 65 which temporarily stores the command.

The command decoder 60 further includes a changeover switch circuit 66, the operation of which is controlled by the busy signal BUSY1a. When the busy signal BUSY1a has the H level, the changeover switch circuit 66 transmits the command signals output from the input buffer 63 to the control decoder 64. When the busy signal BUSY1a has the L level, the changeover switch circuit 66 transmits the command signals output from the input buffer 63 to the register 65.

The command decoder 60 further includes a connecting switch circuit 67, the operation of which is controlled by the busy signal BUSY1b. When the busy signal BUSY1b has the L level, the connecting switch circuit 67 is turned on and provides the command signals temporarily stored in the register 65 to the control decoder 64. When the busy signal BUSY1b has the H level, the connecting switch circuit 67 is turned off.

Figure 13:
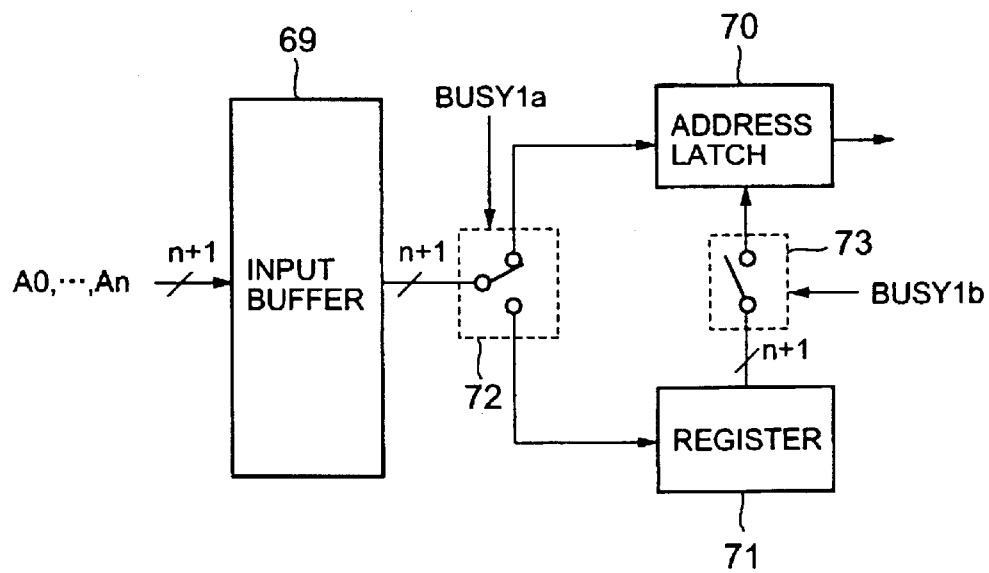
FIG. 13 is a circuit diagram showing an arrangement of an address inputting circuit shown in FIG. 11.
Figure 14:
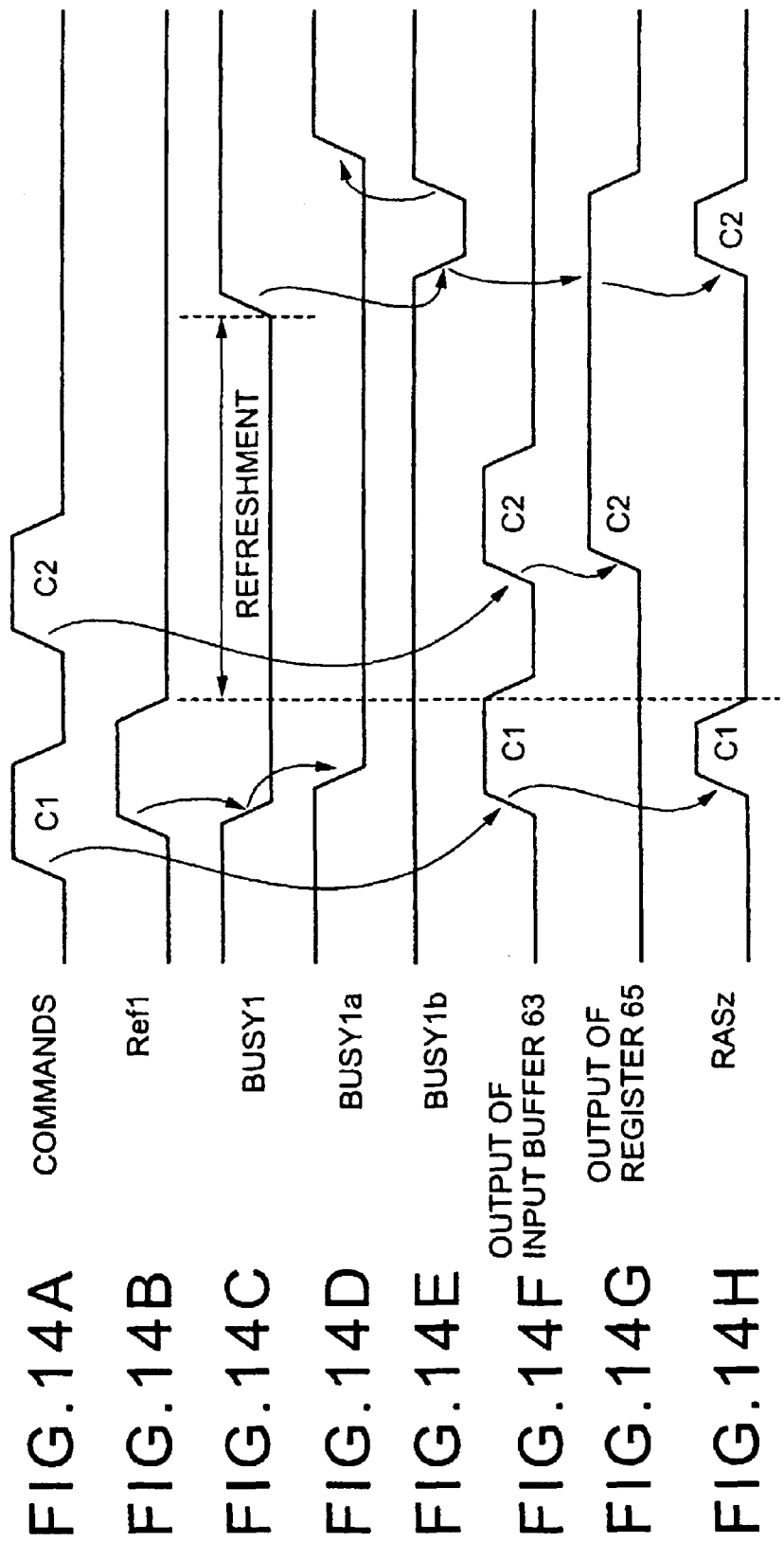
FIGS. 14A through 14H show waveforms illustrating operations of the second embodiment of the semiconductor memory device according to the present invention.

FIG. 13 is a circuit diagram showing an arrangement of the address inputting circuit 61. As shown in the figure, the address inputting circuit 61 includes an input buffer 69 which causes the address signals A0 through An from the controller to undergo buffering, an address latch circuit 70 which holds and outputs the address signals A0 through An, and a register 71 which temporarily stores the address signals A0 through An.

The address inputting circuit 61 further includes a changeover switch circuit 72, the operation of which is controlled by the busy signal BUSY1a. When the busy signal BUSY1a has the H level, the changeover switch circuit 72 transmits the address signals A0 through An output from the input buffer 69 to the address latch circuit 70. When the busy signal BUSY1a has the L level, the changeover switch circuit 72 transmits the address signals A0 through An output from the input buffer 69 to the register 71.

The address inputting circuit 61 further includes a connecting switch circuit 73, the operation of which is controlled by the busy signal BUSY1b. When the busy signal BUSY1b has the L level, the connecting switch circuit 73 is turned on and provides the address signals A0 through An temporarily stored in the register 71 to the address latch circuit 70. When the busy signal BUSY1b has the H level, the connecting switch circuit 73 is turned off.

FIGS. 14A through 14H show waveforms illustrating operations of the second embodiment of the semiconductor memory device according to the present invention. FIG. 14A shows commands output from the controller, FIG. 14B shows the refresh control signal Ref1, FIG. 14C shows the busy signal BUSY1, FIG. 14D shows the busy signal BUSY1a, FIG. 14E shows the busy signal BUSY1b, FIG. 14F shows the output of the input buffer 63 of the command decoder 60, FIG. 14G shows the output of the register 65 of the command decoder 60, and FIG. 14H shows the RAS activating signal RASz.

FIGS. 14A through 14H show a case where the refresh control signal Ref1 is output from the Ref1 generating circuit, 24 of the refresh control circuit 8 after a command C1 is output from the controller, and, in response thereto, the busy signal BUSY1 is output from the BUSY1 outputting circuit 9, and, then, however, a command C2 is output from the controller after the command C1.

In this case, the command C1 is transmitted to the control decoder 64 via the input buffer 63 and changeover switch circuit 66 in the command decoder 60, and the command C1 is executed.

Further, as shown in FIG. 14B, as a result of the refresh control signal Ref1 being output from the Ref1 generating circuit 24 of the refresh control circuit 8, the busy signal BUSY1 is output from the BUSY1 outputting circuit 9 (the BUSY1 signal is caused to have the L level) as shown in FIG. 14C, and the refresh of the semiconductor memory device is performed after the command C1 is executed.

On the other hand, in response to the busy signal BUSY1 coming to have the L level, the level of the busy signal BUSY1$a$ changes from the H level to the L level, and the command C2 output from the controller is temporarily stored in the register 65 via the input buffer 63 and changeover switch circuit 66, in the command decoder 60.

Then, when the refresh of the semiconductor memory device is finished, the level of the busy signal BUSY1 changes from the L level to the H level (the busy signal BUSY1 is negated), in response thereto, the level of the busy signal BUSY1$b$ changes from the H level to the L level, the command C2 temporarily stored in the register 65 is provided to the control decoder 64 via the connecting switch circuit 67, and the command C2 is executed.

Thus, in the second embodiment of the semiconductor memory device according to the present invention, the refresh of the semiconductor memory device is managed by the refresh control circuit 8. Then, when the time for the refresh of the semiconductor memory device comes and there is no command which is being processed, the refresh of the semiconductor memory device can be performed based on the refresh address output from the refresh counter 10 immediately. When the time for the refresh of the semiconductor memory device comes but there is a command which is being processed, the refresh of the semiconductor memory device can be performed based on the refresh address output from the refresh counter 10 after the command is executed. Accordingly, the controller does not need to manage the refresh of the semiconductor memory device.

Further, in the second embodiment of the semiconductor memory device according to the present invention, the busy signal BUSY1 is output from the BUSY1 outputting circuit 9 when the time for the refresh of the semiconductor memory device comes. However, the semiconductor memory device can accept command signals and address signals while the refresh of the semiconductor memory device being performed. Accordingly, the controller can access the semiconductor memory device even while the refresh of the semiconductor memory device is being performed, and, thus, efficient operations can be performed.

Figure 15:
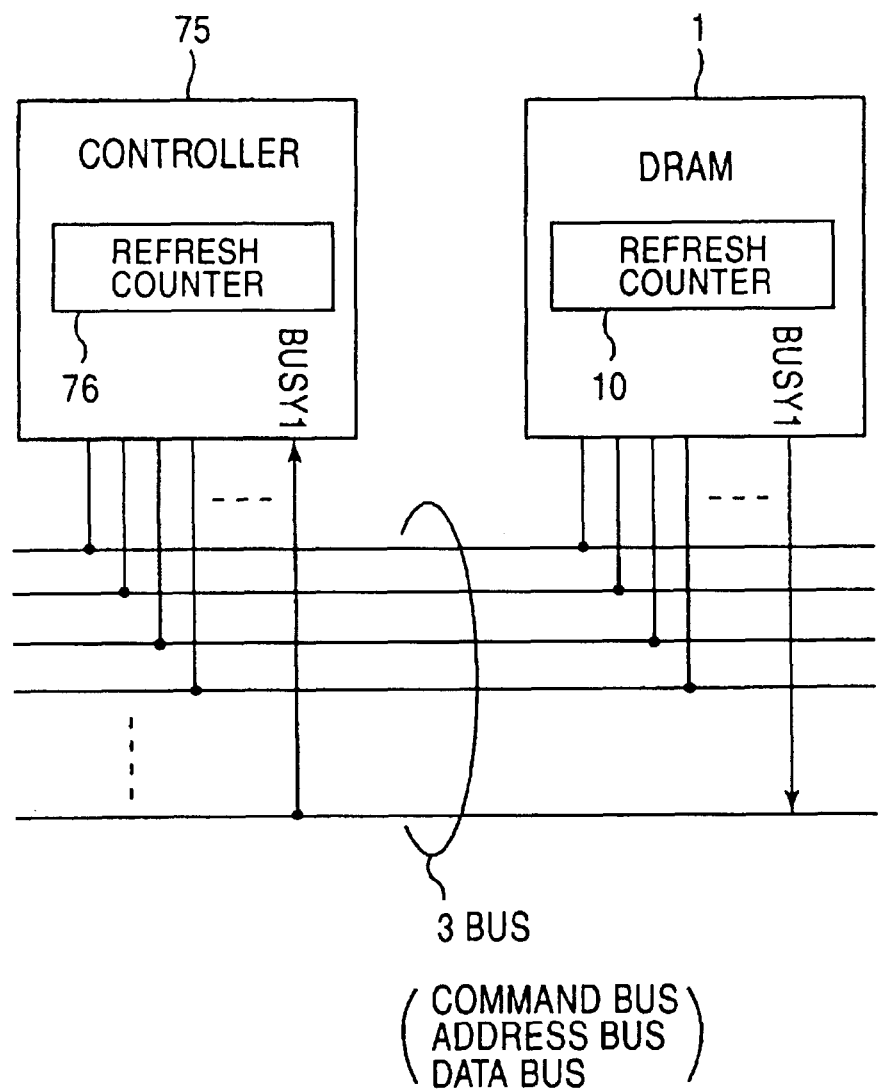
FIG. 15 is a circuit diagram showing an essential portion of a second embodiment of an electronic apparatus according to the present invention.

FIG. 15 is a circuit diagram showing an essential portion of a second embodiment of an electronic apparatus according to the present invention. This electronic apparatus includes a controller 75, the circuit arrangement of which is different from that of the controller 2 of the first embodiment of the electronic apparatus according to the present invention shown in FIG. 1. Except for this point, the second embodiment of the electronic apparatus according to the present invention has the same arrangement as that of the first embodiment of the electronic apparatus according to the present invention.

The controller 75 includes a refresh counter 76 which is the same as the refresh counter 10 included in the DRAM 1 (the first embodiment of the semiconductor memory device according to the present invention shown in FIG. 3, the second embodiment of the semiconductor memory device according to the present invention shown in FIG. 11 or the like). The controller 75 starts the refresh counter 76 each time when receiving the busy signal BUSY1 from the DRAM 1, and can recognize an address for which the DRAM 1 is refreshed.

When the first embodiment of the semiconductor memory device according to the present invention shown in FIG. 3 or the second embodiment of the semiconductor memory device according to the present invention shown in FIG. 11 is used as the DRAM 1 for example, as a result of enabling the banks 11-0 and 11-1 to operate independently, and enabling, when the refresh of one bank is being performed, read/write operation to be performed on the other bank, the controller 75 can avoid accessing a bank which is being refreshed and instead access the other bank.

Thus, in the second embodiment of the electronic apparatus according to the present invention, not only the functions and advantages the same as those obtained from the first embodiment of the electronic apparatus according to the present invention shown in FIG. 1 can be obtained, but also the controller 75 can access the bank other than the bank which is being refreshed. As a result, efficient operations can be performed.

Figure 16:
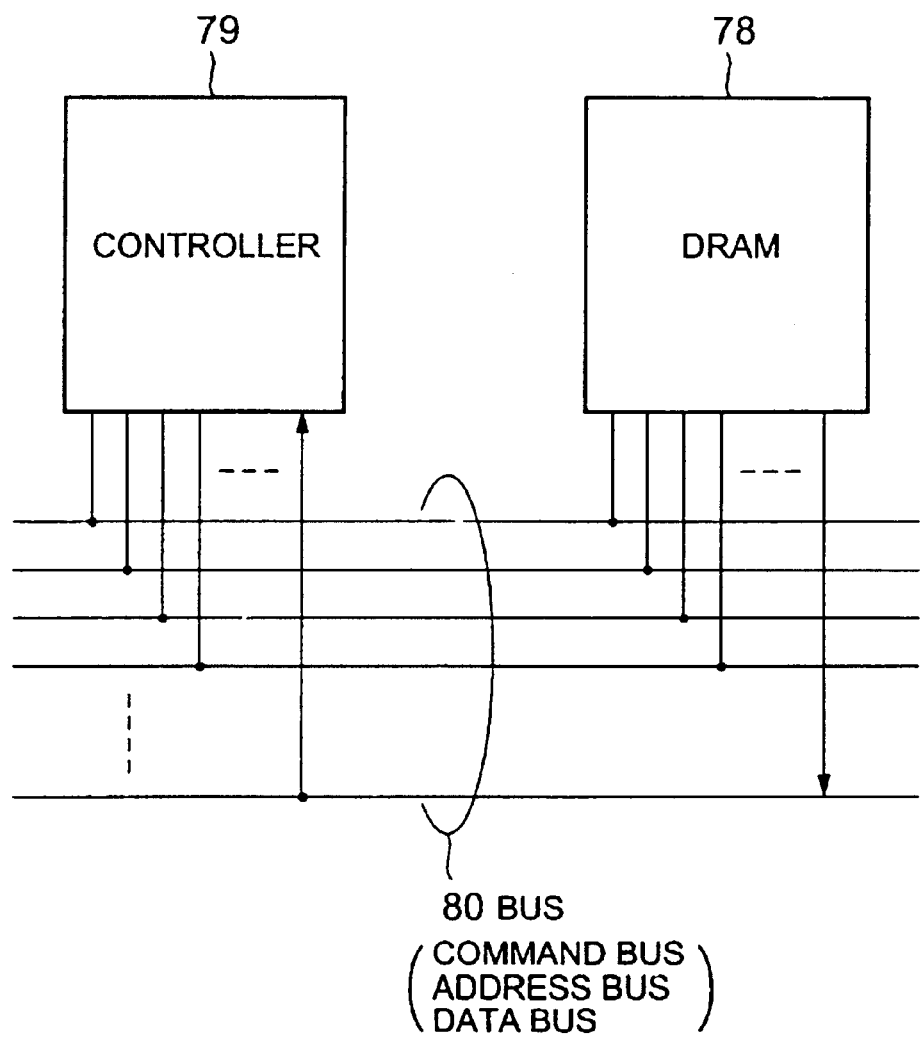
FIG. 16 is a circuit diagram showing an essential portion of a third embodiment of an electronic apparatus according to the present invention.

FIG. 16 is a circuit diagram showing an essential portion of a third embodiment of an electronic apparatus according to the present invention. As shown in the figure, this electronic apparatus includes a DRAM 78, a controller 79 which controls the DRAM 78, and buses 80 such a command bus, an address bus, a data bus and so forth.

The DRAM 78 is configured to self-manage the refresh of itself, and, when the time for the refresh of itself comes, generate the refresh address internally and start the refresh of itself, and, when a command is output from the controller 79 while the refresh of itself being performed, input this command thereto, save the data output from the memory cells to the bit lines during the refresh of itself in a predetermined internal circuit and interrupt the refresh of itself, execute the input command, and, then, restart the refresh of itself after returning the saved data to the bit lines.

In the third embodiment of the electronic apparatus according to the present invention, the DRAM 78 is configured to self-manage the refresh of itself, and, when the time for the refresh of itself comes, generate the refresh address internally and perform the refresh of itself. Therefore, the controller 79 does not need to manage the refresh of the DRAM 78.

Further, the DRAM 78 is configured to, when a command is output from the controller 79 during the refresh of itself, interrupt the refresh of itself, execute the command output from the controller 79, and, then, restart the refresh of itself. Accordingly, the controller 79 can access the DRAM 78 without determining whether or not the DRAM 78 is being refreshed.

Accordingly, even when the third embodiment of the electronic apparatus according to the present invention is applied to a simple terminal such as a cellular phone, and a DRAM which needs to be refreshed is mounted in a simple terminal such as a cellular phone, control of the DRAM by a controller can be easily performed.

Figure 17:
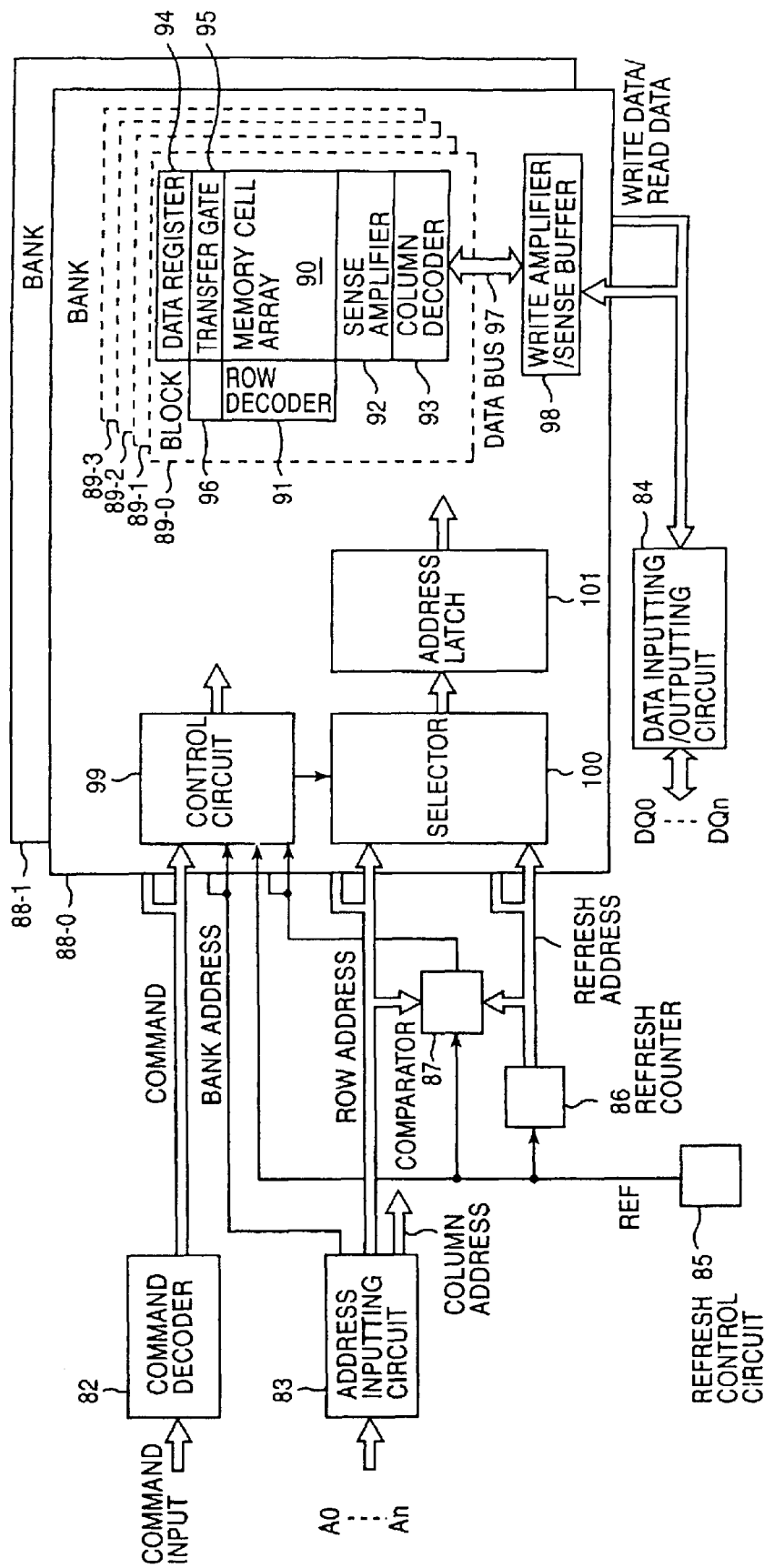
FIG. 17 is a circuit diagram showing an essential portion of a third embodiment of a semiconductor memory device according to the present invention.

FIG. 17 is a circuit diagram showing an essential portion of a third embodiment of a semiconductor memory device according to the present invention. This semiconductor memory device can be used as the DRAM 78 shown in FIG. 16.

As shown in FIG. 17, the semiconductor memory device includes a command decoder 82 which decodes command signals from a controller, an address inputting circuit 83 which inputs address signals A0 through An from the controller thereto, and a data inputting/outputting circuit 84 performing inputting/outputting of write data/read data DQ0 through DQn.

The semiconductor memory device further includes a refresh control circuit 85 which controls the refresh of the semiconductor memory device and outputs a refresh control signal REF periodically, a refresh counter 86 which uses the refresh control signal REF as a trigger signal and outputs a refresh address, and a comparator 87 which compares a row address output from the address inputting circuit 83 with the refresh address output from the refresh counter 86.

The semiconductor memory device further includes banks 88-0 and 88-1 to be selected by a bank address signal. The circuit arrangement of the bank 88-0 is the same as that of the bank 88-1. The bank 88-0 includes blocks 89-0 through 89-3. The blocks 89-0 through 89-3 have the same circuit arrangement. The block 89-0 includes a memory cell array 90, a row decoder 91, a sense amplifier 92, and a column decoder 93.

The block 89-0 further includes a data register 94 for temporarily storing therein data which is being read to the bit lines during the refresh of the semiconductor memory device, a transfer gate 95 for connecting between the bit lines and the data register 94, and a transfer gate signal generating circuit 96 which controls turning on, off of the transfer gate 95.

The bank 88-0 further includes a data bus 97 which is used by the block 89-0 through 89-3 in common, write amplifier/sense buffer 98 which is provided for the blocks 89-0 through 89-3 in common, and a control circuit 99 which controls the bank 88-0.

The bank 88-0 further includes a selector 100 which selects the row address signals output from the address inputting circuit 83 at the time of reading/writing of data, and selects the refresh address output from the refresh counter 86 at the time of the refresh of the semiconductor memory device, and an address latch circuit 101 which holds and outputs the address signals output from the selector 100.

Figure 18:
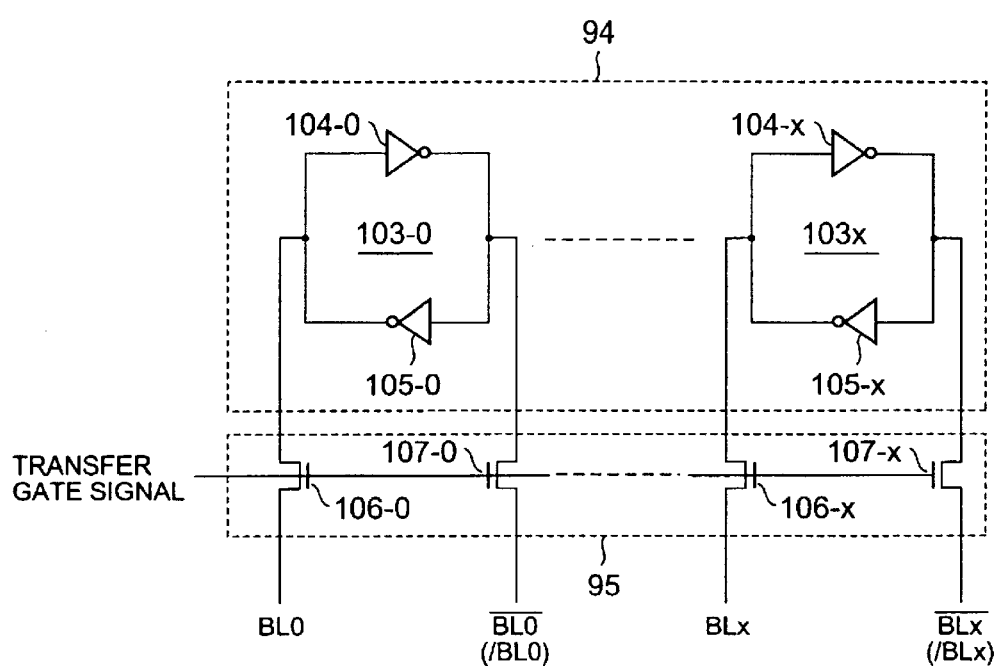
FIG. 18 is a circuit diagram showing an arrangement of a data register and a transfer gate shown in FIG. 17.

FIG. 18 is a circuit diagram showing an arrangement of the data register 94 and transfer gate 95. As shown in the figure, bit lines BL0, /BL0, . . . , BLx and /BLx are connected to the transfer gate 95. The data register 94 includes flip-flop circuits 103-0, . . . , 103-$x$, which include inverters 104-0, 105-0, . . . , and 104-$x$ and 105-$x$, respectively. The transfer gate 95 includes NMOS transistors 106-0, 107-0, . . . , 106-$x$ and 107-$x$, turning on, off of each of which is controlled by the transfer gate signal.

Figures 20A, 20B:
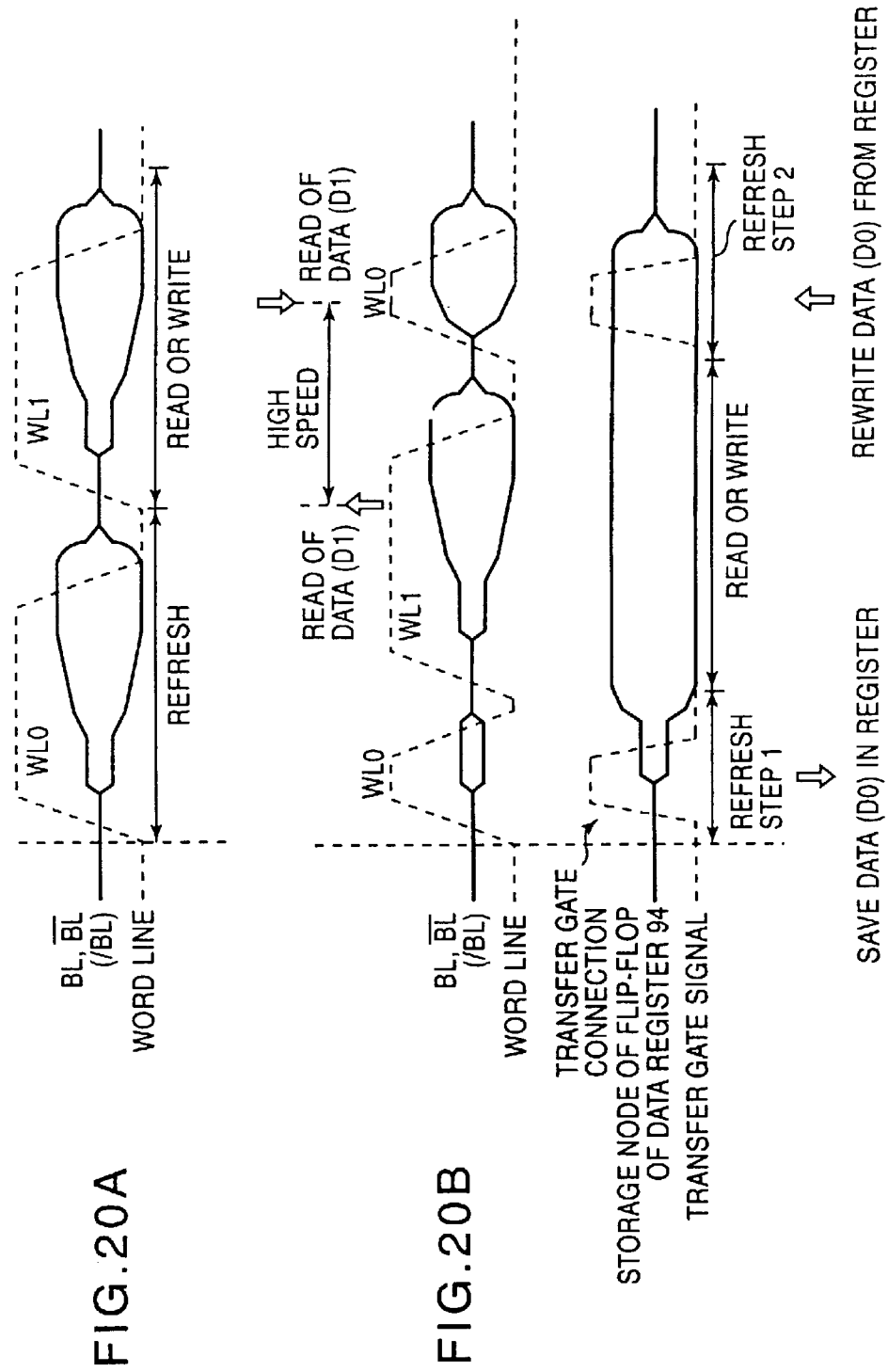
FIGS. 20A and 20B show waveforms for comparing a second example of operations of the third embodiment of the semiconductor memory device according to the present invention with the example of operations of the DRAM in the related art.

FIGS. 19 and 20 show waveforms for comparing first and second examples of operations of the third embodiment of the semiconductor memory device according to the present invention with an example of operations of a DRAM in the related art. FIGS. 19A and 20A show the example of the DRAM in the related art, FIG. 19B shows the first example of operations of the third embodiment of the semiconductor memory device according to the present invention, and FIG. 20B shows the second example of operations of the third embodiment of the semiconductor memory device according to the present invention.

These examples of operations show a case where the memory cells selected by a word line WL1 are accessed during the refresh of the memory cells selected by a word line WL0. In the case in the related art, because no read/write operation can be performed on the memory cells selected by the word line WL1 during the refresh of the memory cells selected by the word line WL0, read/write operation can be performed on the memory cells selected by the word line WL1 after the refresh of the memory cells selected by the word line WL0 is finished, as shown in FIGS. 19A and 20A.

In contrast to this, in the case of the first example of operations of the third embodiment of the semiconductor memory device according to the present invention, when the refresh of the memory cells selected by the word line WL0 is started, the transfer gate signal is caused to have the H level during increase in the voltage between the bit lines BL and /BL by means of the sense amplifier, the transfer gate 95 is turned on, data D0 of the memory cells output to the bit lines BL and /BL is saved in the data register 94, the word line WL0 comes to be non-selected, and, also, the transfer gate signal comes to have the L level, as shown in FIG. 19B.

Then, the word line WL1 is selected, and read/write operation is performed. Then, when the word line WL1 comes to be non-selected and the read/write operation is finished, the transfer gate signal comes to have the H level, the transfer gate 95 is turned on, the data stored in the data register 94 is transferred to the bit lines BL and /BL, and, also, the word line WL0 is again selected, and the refresh of the memory cells selected by the word line WL0 is restarted.

In the case of the second example of operations of the third embodiment of the semiconductor memory device according to the present invention, when refresh of the memory cell selected by the word line WL0 is started, the transfer gate signal is caused to have the H level before the voltage between the bit lines BL and /BL is increased by means of the sense amplifier, that is, at a stage at which the voltage between the bit lines BL and /BL appears by means of the memory cells, the transfer gate 95 is turned on, data D0 of the memory cell output to the bit lines BL and /BL is saved in the data register 94, the transfer gate signal comes to have the L level, and the word line WL0 comes to be non-selected, as shown in FIG. 20B.

Then, the word line WL1 is selected, and read/write operation is performed. Then, when the word line WL1 comes to be non-selected and the read/write operation is finished, the transfer gate signal comes to have the H level, the transfer gate 95 is turned on, the data stored in the data register 94 is transferred to the bit lines BL and /BL, and, also, the word line WL0 is again selected, the refresh of the memory cells selected by the word line WL0 is restarted. In the case of the second example of operations of the third embodiment of the semiconductor memory device according to the present invention, in comparison to the case of the first example of operations of the third embodiment of the semiconductor memory device according to the present invention, the read/write operation through the word line WL1 is performed at high speed.

Thus, in the third embodiment of the semiconductor memory device according to the present invention, when external access occurs during the refresh of the semiconductor memory device, the refresh of the semiconductor memory device is performed in two steps, that is, a refresh step 1 and a refresh step 2. In the refresh step 1, the data on the bit lines BL and /BL during the refresh is saved in the data register 94. In the refresh step 2, after execution of a command based on the external access is finished, the data stored in the data register 94 is transferred to the bit lines BL and /BL, and the refresh is restarted.

Figure 21:
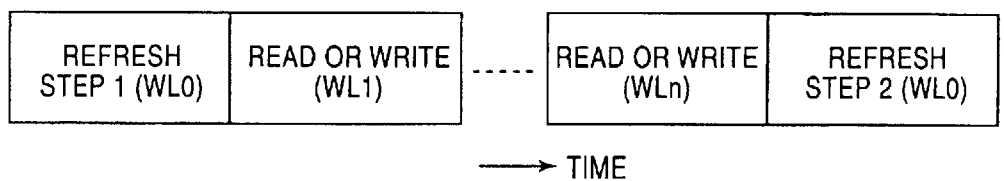
FIG. 21 is a time chart showing a third example of operations of the third embodiment of the semiconductor memory device according to the present invention.

FIG. 21 is a time chart showing a third example of operations of the third embodiment of the semiconductor memory device according to the present invention. In the third example of operations of the third embodiment of the semiconductor memory device according to the present invention, between the refresh step 1 and the refresh step 2, a plurality of word lines are selected in sequence, and read or write operations are performed on the memory cells selected by these plurality of word lines.

Figure 22:
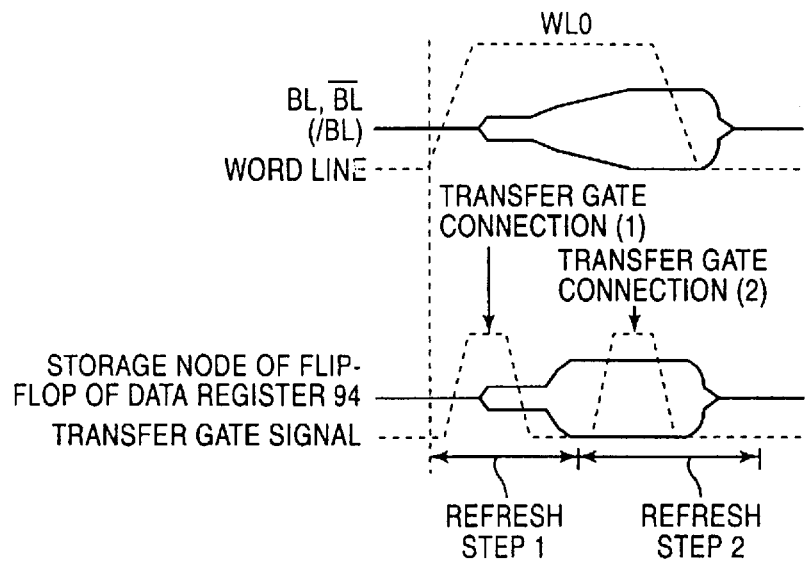
FIG. 22 shows waveforms illustrating a fourth example of operations of the third embodiment of the semiconductor memory device according to the present invention.
Figure 23:
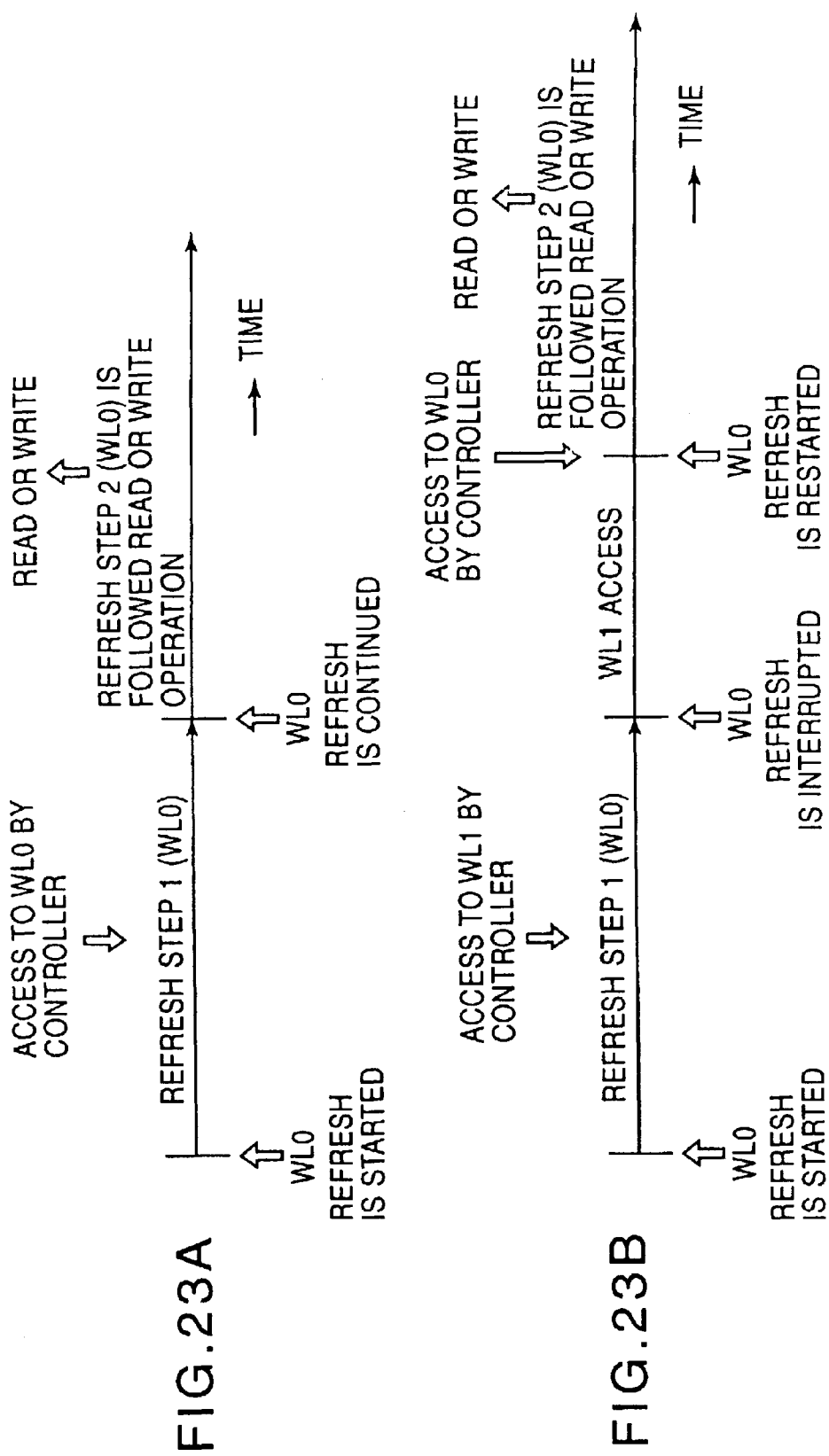
FIGS. 23A and 23B are time charts showing a fifth example of operations and a sixth example of operations of the third embodiment of the semiconductor memory device according to the present invention.

FIG. 22 shows waveforms illustrating a fourth example of operations of the third embodiment of the semiconductor memory device according to the present invention, and shows a case where no external access occurs during the refresh of the memory cells through the word line WL0. In this case, the refresh is performed wherein the refresh step 1 and the refresh step 2 are performed successively. In this case, it is advantageous not to perform turning on of the transfer gate in the refresh step 2.

FIGS. 23A and 23B are time charts showing a fifth example of operations and a sixth example of operations of the third embodiment of the semiconductor memory device according to the present invention. FIG. 23A shows the fifth example of operations and FIG. 23B shows the sixth example of operations.

The fifth example of operations of the third embodiment of the semiconductor memory device according to the present invention is an example of operations in a case where access to the word line WL0 is performed by the controller when the word line WL0 is selected for the refresh of the corresponding memory cells. In this case, the refresh step 1 and the refresh step 2 are performed continuously, and, the second refresh step 2 is followed by read or write operation on the memory cells selected by the word line WL0.

These operations are performed when it is determined, as a result of the comparator 87 comparing the row address output from the address inputting circuit 83 with the refresh address output from the refresh counter 86, that the row address output from the address inputting circuit 83 is coincident with the refresh address output from the refresh counter 86. Through the above-described fifth example of operations of the third embodiment of the semiconductor memory device according to the present invention, it is possible to read data from or write data in the memory cells which are being refreshed when the controller accesses the corresponding word line.

The sixth example of operations of the third embodiment of the semiconductor memory device according to the present invention is an example of operations in a case where access to the word line WL1 and access to the word line WL0 are performed by the controller successively when the word line WL0 is selected for the refresh of the corresponding memory cells. In this case, read or write operation on the memory cells selected by the word line WL1 is performed after the refresh step 1 is performed, and, then, continuously, the refresh step 2 is performed, and, the second refresh step 2 is followed by read or write operation on the memory cells selected by the word line WL0.

Also these operations are performed when it is determined, as a result of the comparator 87 comparing the row address output from the address inputting circuit 83 with the refresh address output from the refresh counter 86, that the row address output from the address inputting circuit 83 is coincident with the refresh address output from the refresh counter 86. Through the sixth example of operations of the third embodiment of the semiconductor memory device according to the present invention, it is possible to read data from or write data in the memory cells which are being refreshed when the controller accesses the corresponding word line.

Figure 24:
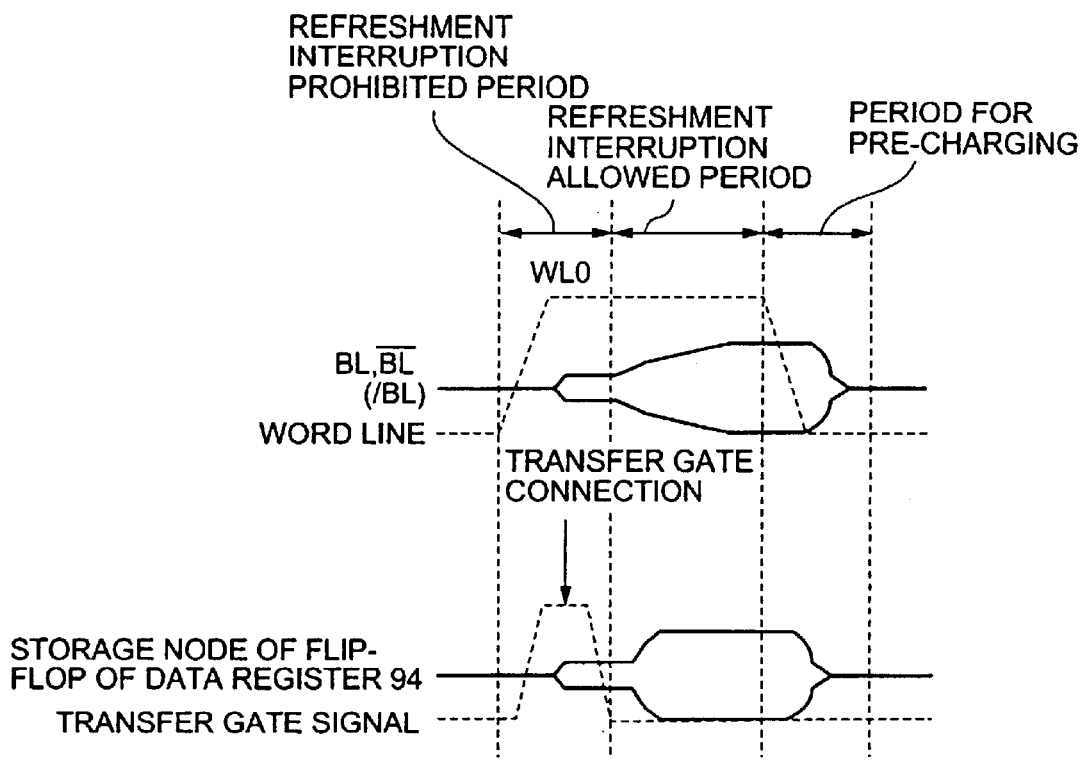
FIGS. 24 and 25 are time charts showing a seventh example of operations of the third embodiment of the semiconductor memory device according to the present invention.

FIG. 24 shows waveforms illustrating a seventh example of operations of the third embodiment of the semiconductor memory device according to the present invention. In this example, at an early stage at which the refresh of memory cells is started, the time period required for completing data transfer to the data register 94 is determined as a refresh interruption prohibited period, and the subsequent time period is determined as a refresh interruption allowed period. Then, a time period for pre-charging required for performing read or write operation after interrupting the refresh is adjusted depending on the time at which the refresh has been interrupted.

Figure 25:
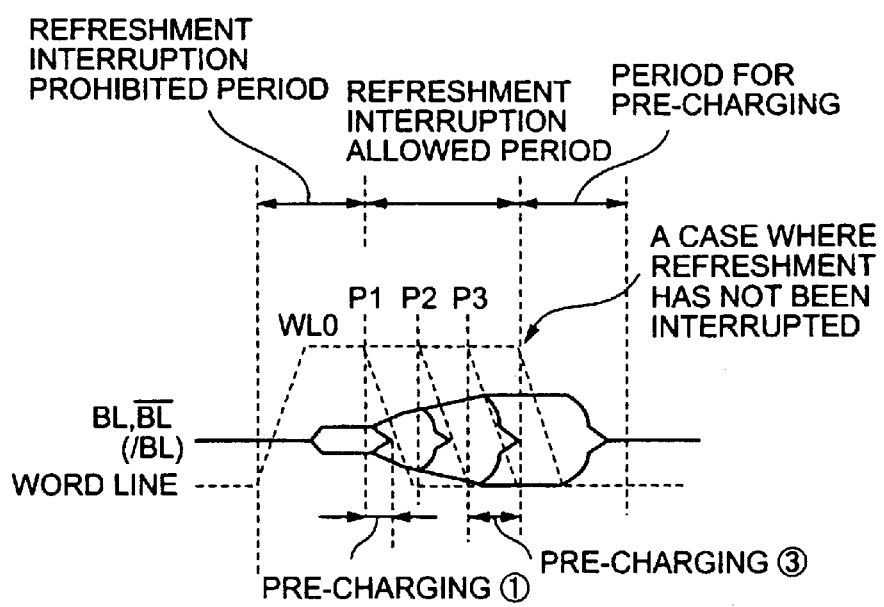

That is, as shown in FIG. 25, it is possible to interrupt the refresh at any time (for example, P1, P2, P3) until pre-charging is started after the refresh interruption prohibited period. However, the time period required for pre-charging after interruption of the refresh is different depending on the opening width between the bit lines, that is, the time at which the refresh has been interrupted.

For example, the time period required for pre-charging becomes longer in the order of the case where the refresh has been interrupted at P1, the case where the refresh has been interrupted at P2, the case where the refresh has been interrupted at P3, and the case where the refresh has not been interrupted.

Thus, the earlier the refresh is interrupted, the shorter the time period required for pre-charging, by which the refresh interruption is followed, and the earlier subsequent read or write operation can be started. It is preferable to provide a pre-charging signal generating circuit which enables achievement thereof.

Figure 26:
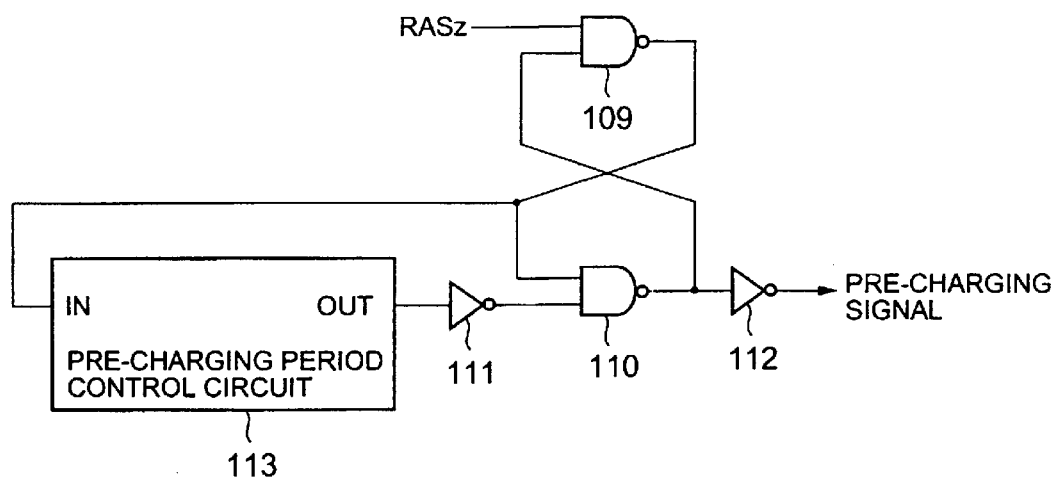
FIG. 26 is a circuit diagram showing an arrangement of a pre-charging signal generating circuit included in the third embodiment of the semiconductor memory device according to the present invention.

FIG. 26 is a circuit diagram showing an arrangement of the pre-charging signal generating circuit. As shown in the figure, the pre-charging signal generating circuit includes NAND circuits 109 and 110 which form a flip-flop circuit, inverters 111 and 112, and a pre-charging period control circuit 113 which controls the length of a pre-charging signal, that is, the time period for pre-charging.

Figure 27:
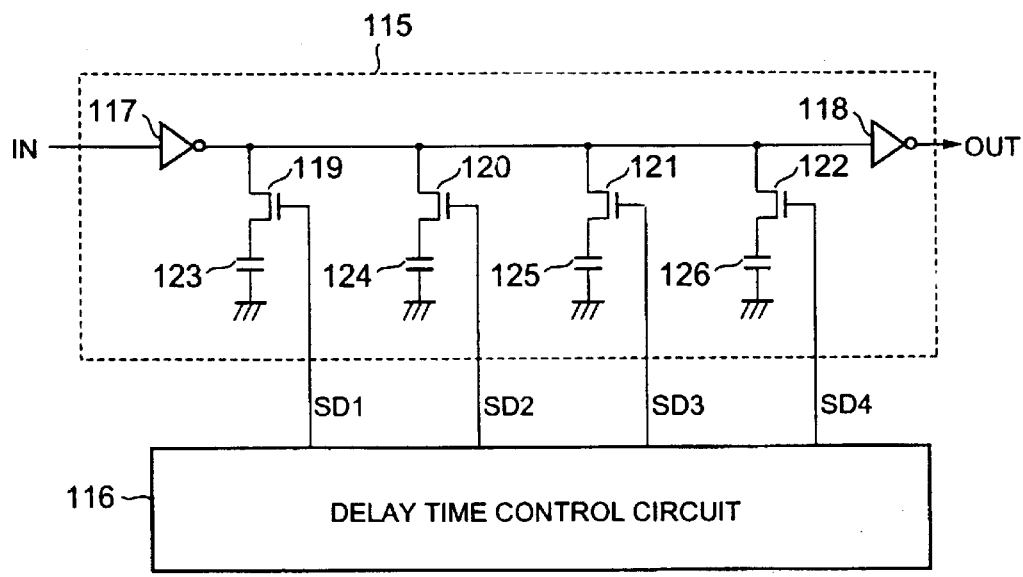
FIG. 27 is a circuit diagram showing an arrangement of a pre-charging period control circuit shown in FIG. 26.

FIG. 27 is a circuit diagram showing an arrangement of the pre-charging period control circuit 113. As shown in the figure, the pre-charging period control circuit 113 includes a variable delaying circuit 115, and a delay time control circuit 116 which outputs delay time control signals SD1 through SD4 for controlling the delay time of the variable delaying circuit 115. The delaying circuit 115 includes inverters 117 and 118, NMOS transistors 119 through 122, turning on, off of which is controlled by the delay time control signals SD1 through SD4, and capacitors 123 through 126.

Figure 28:
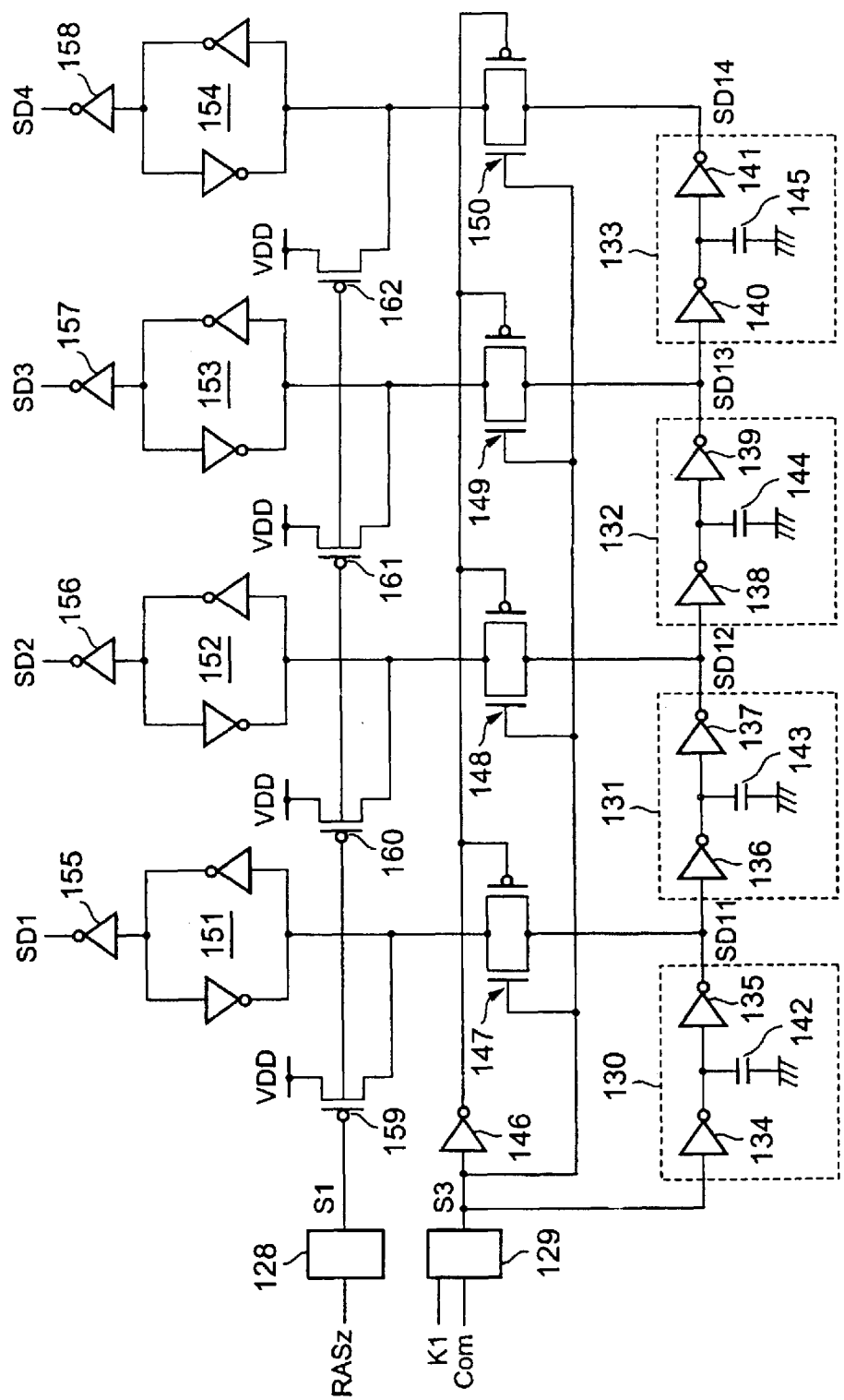
FIG. 28 is a circuit diagram showing an arrangement of a delay time control circuit shown in FIG. 27.

FIG. 28 is a circuit diagram showing an arrangement of the delay time control circuit 116. As shown in the figure, the delay time control circuit 116 includes a reset signal generating circuit 128 which inputs the RAS activating signal RASz thereto and outputs a reset signal S1, and a refresh time measuring signal generating circuit 129 which inputs a refresh interruption prohibiting signal K1 having the H level during the refresh interruption prohibited period and the internal command signal Com thereto, and generates a refresh time measuring signal S3.

The delay time control circuit 116 further includes delaying circuits 130 through 133, which include inverters 134 through 141, and capacitors 142 through 145, respectively. The respective delay times of the delaying circuits 130 through 133 are set so that the total of the respective delay times of the delaying circuits 130 through 133 be equal to the refresh interruption allowed period.

Further, in FIG. 28, an inverter 146 inverts the refresh time measuring signal S3. Transfer gates 147 through 150 consist of PMOS transistors and NMOS transistors, respectively. These transfer gates are turned on when the refresh time measuring signal S3 has the H level and the output of the inverter 146 has the L level. These transfer gates are turned off when the refresh time measuring signal S3 has the L level and the output of the inverter 146 has the H level.

Further, latch circuits 151 through 154 hold and output the outputs SD11 through SD14 of the delaying circuits 130 through 133, respectively. Inverters 155 through 158 invert the outputs of the latch circuits 151 through 154 and output the delay time control signals SD1 through SD4, respectively.

PMOS transistors 159 through 162 reset the latch circuits 151 through 154, turning on, off of the transistors 159 through 162 is controlled by the reset signal S1, and the transistors 159 through 162 are turned on when the reset signal S1 has the L level, but are turned off when the reset signal S1 has the H level.

Figure 29:
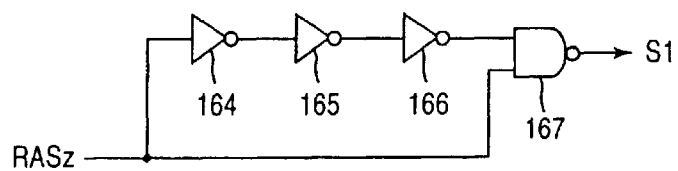
FIG. 29 is a circuit diagram showing an arrangement of a reset signal generating circuit shown in FIG. 28.

FIG. 29 is a circuit diagram showing an arrangement of the reset signal generating circuit 128. In the figure, inverters 164 through 166 form a inverting and delaying circuit which inverts and delays the RAS activating signal RASz. A NAND circuit 167 processes, in accordance with the NAND manner, the RAS activating signal RASz and the output of the inverter 166, and outputs the reset signal S1.

Figure 30:
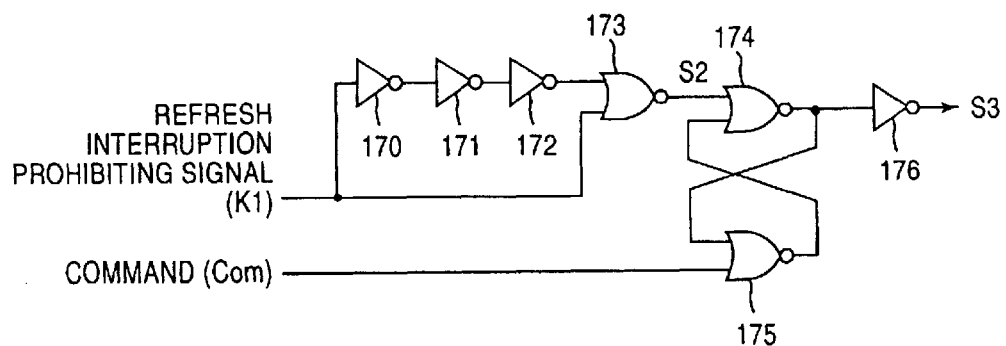
FIG. 30 is a circuit diagram showing an arrangement of a refresh time measuring signal generating circuit shown in FIG. 28.
Figure 31:
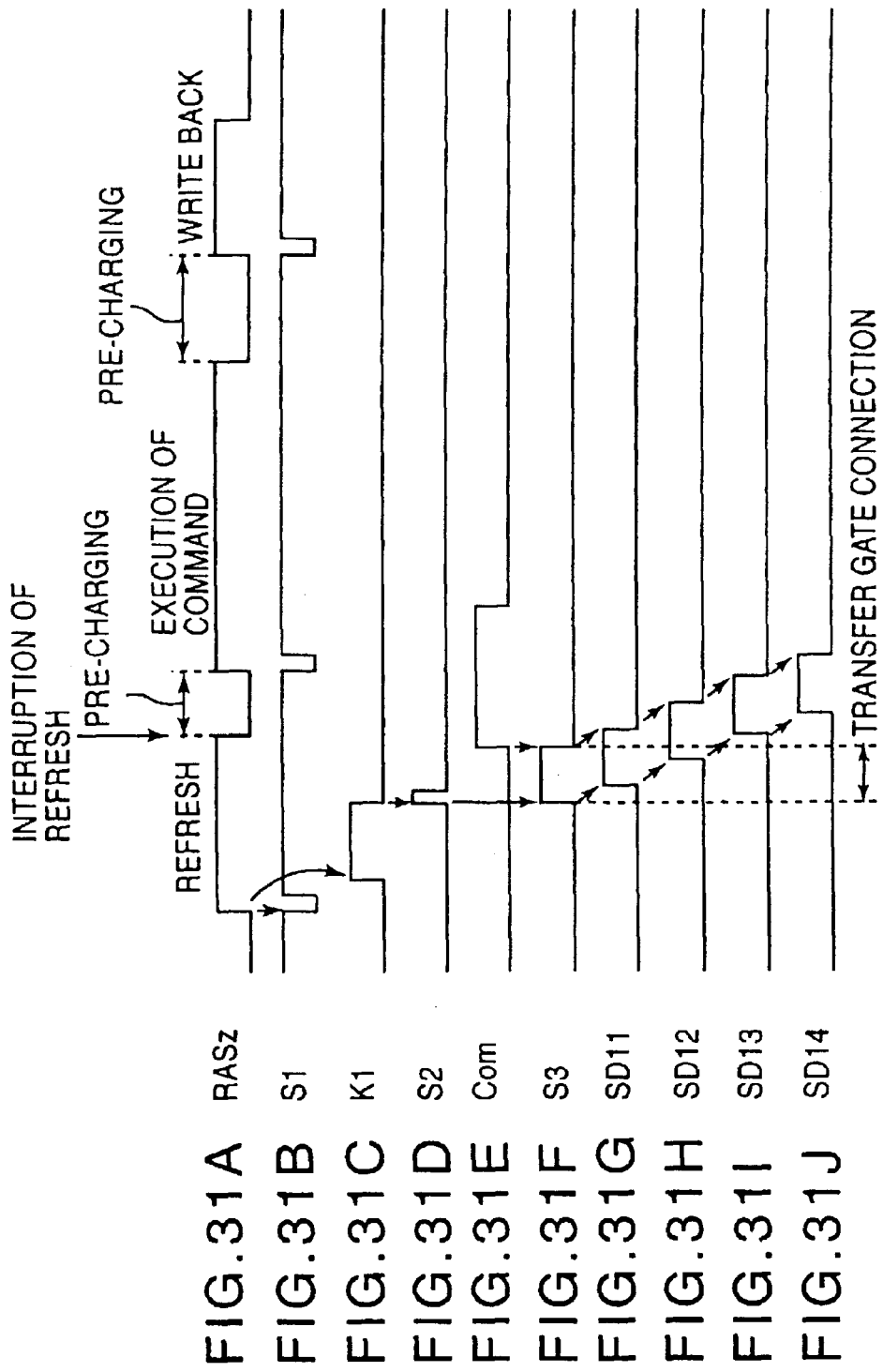
FIGS. 31A through 31J show waveforms illustrating operations of a delay time control circuit shown in FIG. 28.
Figure 32:
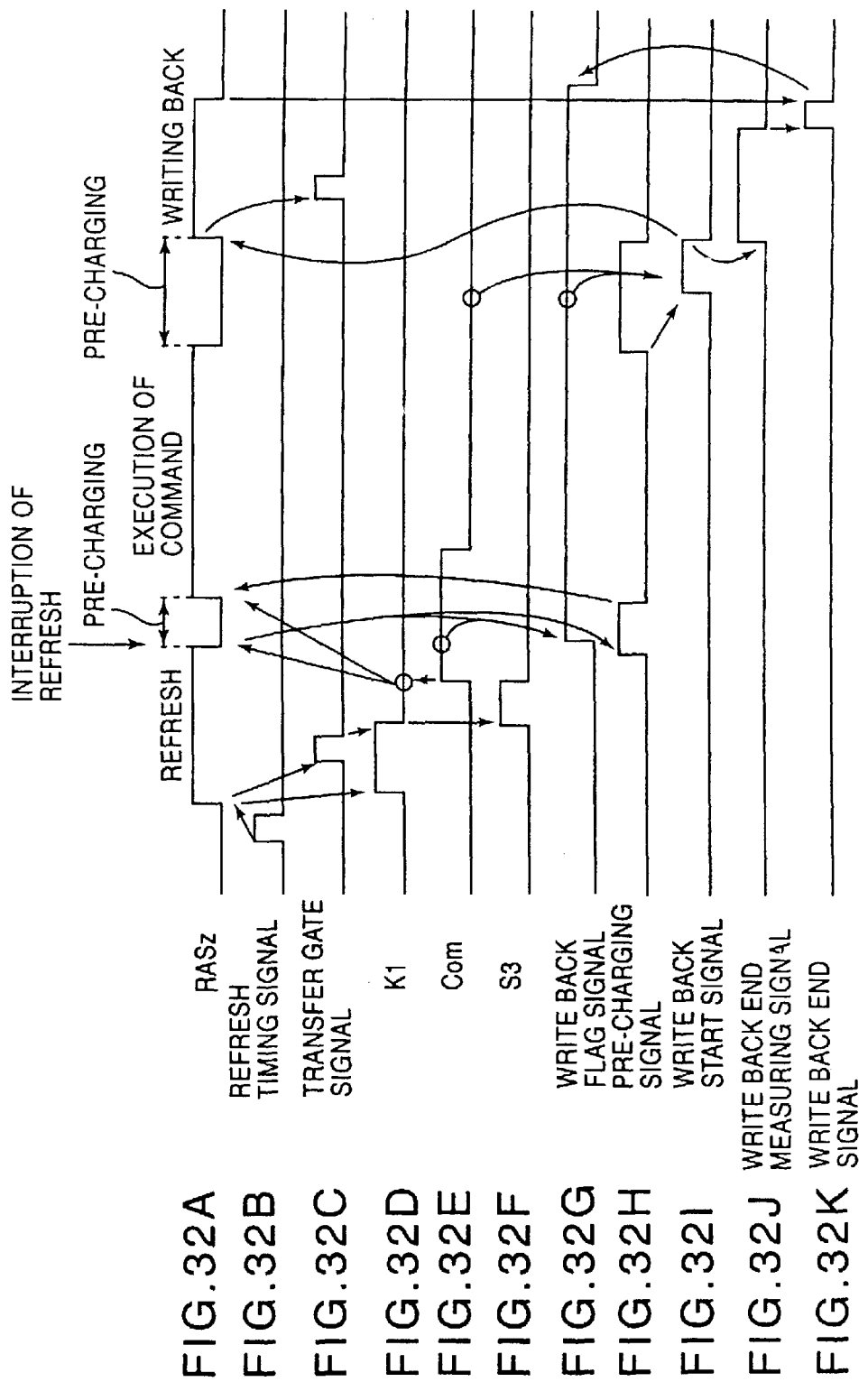
FIGS. 32A through 32K show waveforms illustrating an example of operations of the third embodiment of the semiconductor memory device according to the present invention.

FIG. 30 is a circuit diagram showing an arrangement of the refresh time measuring signal generating circuit 129. In the figure, inverters 170 through 172 form an inverting and delaying circuit which inverts and delays the refresh interruption prohibiting signal K1. A NOR circuit 173 processes, in accordance with the NOR manner, the refresh interruption prohibiting signal K1 and the output of the inverter 172. NOR circuits 174 and 175 form a flip-flop circuit which inputs the output of the NOR circuit 173 and the internal command signal Com thereto. An inverter 176 inverts the output of the NOR circuit 174 and outputs the refresh time measuring signal S3.

FIGS. 31A through 31J show waveforms illustrating operations of the delay time control circuit 116. FIG. 31A shows the RAS activating signal RASz, FIG. 31B shows the reset signal S1, FIG. 31C shows the refresh interruption prohibiting signal K1, FIG. 31D shows the output S2 of the NOR circuit 173 of the refresh time measuring signal generating circuit 129, FIG. 31E shows the internal command signal Com, FIG. 31F shows the refresh time measuring signal S3, FIG. 31G shows the output SD11 of the delaying circuit 130, FIG. 31H shows the output SD12 of the delaying circuit 131, FIG. 31I shows the output SD13 of the delaying circuit 132, and FIG. 31J shows the output SD14 of the delaying circuit 133.

When the RAS activating signal RASz rises from the L level to the H level in order to perform the refresh, the reset signal S1 having the L level is output from the reset signal generating circuit 128, the PMOS transistors 159 through 162 are turned on, the outputs of the latch circuits 151 through 154 are caused to have the L level, and the delay time control signal SD1 through SD4 are caused to have the H level.

Further, during the refresh interruption prohibited period, the refresh interruption prohibiting signal K1 having the H level is output, the output S2 of the NOR circuit 173 of the refresh time measuring signal generating circuit 129 comes to have the H level temporarily, and, as a result, the refresh time measuring signal S3 comes to have the H level. This is delayed by the delaying circuit 130 through 133, and, also, the transfer gates 147 through 150 are turned on.

Then, when the command signal Com is output when the outputs SD11 and SD12 of the delaying circuits 130 and 131 have the H level, and the outputs SD13 and SD14 of the delaying circuits 132 and 133 have the L level, for example, the transfer gates 147 through 150 are turned off, and the latch circuits 151 through 154 hold and output the outputs SD11 through SD14 of the delay circuits 130 through 133.

As a result, in this case, the outputs of the latch circuits 151 and 152 have the L level, the outputs of the latch circuits 152 and 153 have the H level, the delay time control signals SD1 and SD2 have the H level, and the delay time control signals SD3 and SD4 have the L level. As a result, the thus obtained delay time is such as that obtained only by means of the capacitors 123 and 124. That is, in the third embodiment of the semiconductor memory device according to the present invention, the time for pre-charging is set depending on the length of the refresh time measuring signal S3, that is, the time period during which the refresh time measuring signal S3 has the H level.

Accordingly, in the pre-charging signal generating circuit shown in FIG. 26, the pre-charging signal is generated for a time period depending on a time period of the refresh. For example, in FIG. 25, when the refresh has been interrupted at P1, the pre-charging signal is generated for the time period equal to the delay time obtained by means of the capacitor 123. When the refresh has been interrupted at P2, the pre-charging signal is generated for the time period equal to the delay time obtained by means of the capacitors 123 and 124. When the refresh has been interrupted at P3, the pre-charging signal is generated for the time period equal to the delay time obtained by means of the capacitors 123 through 125. When the refresh has not been interrupted, the pre-charging signal is generated for the time period equal to the delay time obtained by means of the capacitors 123 through 126.

FIGS. 32A through 32K show waveforms illustrating an example operations of the third embodiment of the semiconductor memory device according to the present invention. FIG. 32A shows the RAS activating signal RASz, FIG. 32B shows a refresh timing signal, FIG. 32C shows the transfer gate signal, FIG. 32D shows the refresh interruption prohibiting signal K1, FIG. 32E shows the internal command signal Com, FIG. 32F shows the refresh time measuring signal S3, FIG. 32G shows a write back flag signal, FIG. 32H shows the pre-charging signal, FIG. 32I shows a write back start signal, FIG. 32J shows a write back end measuring signal, FIG. 32K shows a write back end signal.

That is, in the third embodiment of the semiconductor memory device according to the present invention, when the time for the refresh comes, a refresh timing signal is generated. In response thereto, the RAS activating signal RASz is generated. Thereby, the transfer gate signal for transferring the data on the bit lines during the refresh to the data register 94 and the refresh interruption prohibiting signal K1 for setting the refresh interruption prohibited period are generated.

Then, when transfer of the data on the bit lines to the data register 94 is completed, the refresh interruption prohibiting signal K1 is negated. Then, after that, when a command is input, in response thereto, the refresh is interrupted. When a command is input during the refresh interruption prohibited period, the refresh is interrupted immediately after the refresh interruption prohibiting signal K1 is negated.

When the refresh is interrupted, the refresh time measuring signal S3 for measuring the time period from the time the refresh interruption prohibiting signal K1 is negated to the time the command is input is generated, and, depending on the length of the refresh time measuring signal S3 (time period during which the refresh time measuring signal S3 has the H level), the pre-charging time is set.

Further, in the third embodiment of the semiconductor memory device according to the present invention, when the refresh is interrupted and a command is executed, the write back flag signal is generated in response to the interruption of the refresh. The write back flag signal expresses necessity of writing back of the data from the data register 94 to the bit lines, which should be performed in the refresh step 2 after the command is executed.

Further, in a case where the write back flag signal is output, and, also, execution of the command is finished (the internal command signal Com come to have the L level), when pre-charging is performed, a write back start signal is caused to have the H level. Then, when pre-charging is finished, the write back start signal is caused to have the L level. Then, the RAS activating signal is caused to have the H level for the writing back operation, and, also, a write back end measuring signal is caused to have the H level.

The level of the write back end measuring signal returns from the H level to the L level when the time required for the writing back operation has elapsed. The write back end signal is a signal having a pulse of the H level when the RAS activating signal RASz comes to have the L level after the write back end measuring signal comes to have the L level, and indicating that the writing back operation has been finished, but maintaining to have the L level when the RAS activating signal RASz comes to have the L level before the write back end measuring signal comes to have the L level (when a command is input during the writing back operation), and indicating that the writing back operation has not been finished. Accordingly, when a command is input during the writing back operation, the writing back operation is interrupted, and, after execution of the command is performed, the writing back operation is performed.

In the third embodiment of the semiconductor memory device according to the present invention, the refresh control circuit 85 manages the refresh of the semiconductor memory device, and, when the time for the refresh of the semiconductor memory device comes and there is no command which is being processed, the refresh of the semiconductor memory device can be performed based on the refresh address output from the refresh counter 86 immediately. When the time for the refresh of the semiconductor memory device comes but there is a command which is being processed, the refresh of the semiconductor memory device can be performed based on the refresh address output from the refresh counter 86 after the command is executed. Accordingly, the controller does not need to manage the refresh of the semiconductor memory device.

Further, command signals can be accepted by the third embodiment of the semiconductor memory device according to the present invention even during refresh of the semiconductor memory device. When command signals are accepted by the semiconductor memory device, the refresh is interrupted and the command is executed. Then, the refresh can be restarted. Accordingly, the controller can access the third embodiment of the semiconductor memory device according to the present invention without monitoring whether or not this semiconductor memory device is being refreshed. As a result, it is possible to perform efficient operations.

Figure 33:
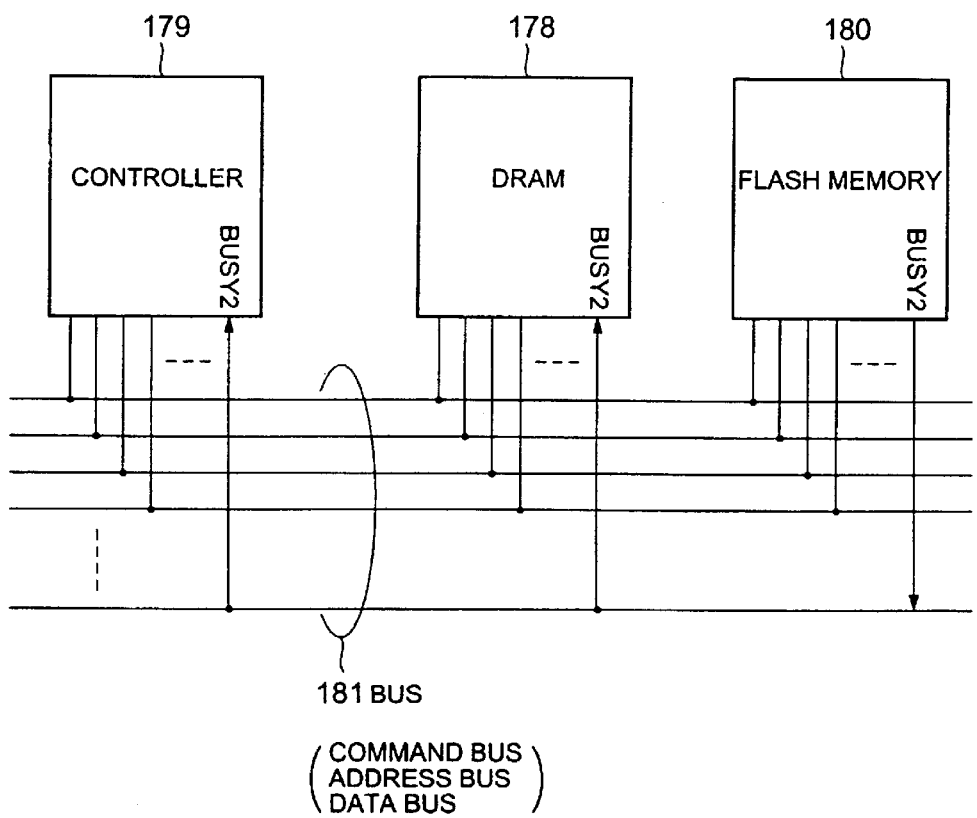
FIG. 33 is a circuit diagram showing an essential portion of a fourth embodiment of an electronic apparatus according to the present invention.

FIG. 33 is a circuit diagram showing an essential portion of a fourth embodiment of an electronic apparatus according to the present invention. In the figure, a controller 179 controls a DRAM 178, and a flash memory 180 is used for saving therein data stored in the DRAM 178. This electronic apparatus further includes buses 181 such as a command bus, an address bus, a data bus and so forth. The flash memory 180 is configured to output a busy signal BUSY2 during read/write/erase operation, that it, when not able to accept access thereto.

The controller 179 is configured to cause all command signals and address signals to have the L level when a main battery goes dead, or is removed, and, thereby, power supply by the main battery is stopped.

Further, the DRAM 178 is configured to automatically output the data to the data bus in accordance with the addresses generated by an internal address counter for saving the data, when the busy signal BUSY2 is not output from the flash memory 180 in a case where all the command signals and address signals output from the controller 179 have the L level.

Further, the flash memory 180 is configured to automatically write thereto the data output from the DRAM 178 based on the addresses generated by an internal address counter in a case where all the command signals and address signals output from the controller 179 have the L level.

In the fourth embodiment of the electronic apparatus according to the present invention configured as described above, it is possible that the data stored in the DRAM 178 is saved in the flash memory 180 which does not need to be refreshed, when the main battery goes dead, or is removed, and, thereby, power supply by the main battery is stopped.

Accordingly, when the fourth embodiment of the electronic apparatus according to the present invention is applied to a simple terminal such as a cellular phone in which a DRAM is mounted, power consumption of a backup battery due to the refresh of the DRAM 178 can be reduced as much as possible, when a main battery goes dead, or is removed, and, thereby, power supply by the main battery is stopped.

Further, because the flash memory 180 is configured to output the busy signal BUSY2 during read/write/erase operation, and the DRAM 178 is configured to perform the refresh thereof using a time during which the busy signal BUSY2 is output, the refresh of the DRAM 178 can be performed while the data is being saved in the flash memory 180 and necessary data can be retained by the DRAM 178.

In the fourth embodiment of the electronic apparatus according to the present invention, the flash memory 180 which is a nonvolatile semiconductor memory device is provided for saving therein the data stored in the DRAM 178. However, instead, various semiconductor memory devices which do not need to be refreshed can be used.

Figure 34:
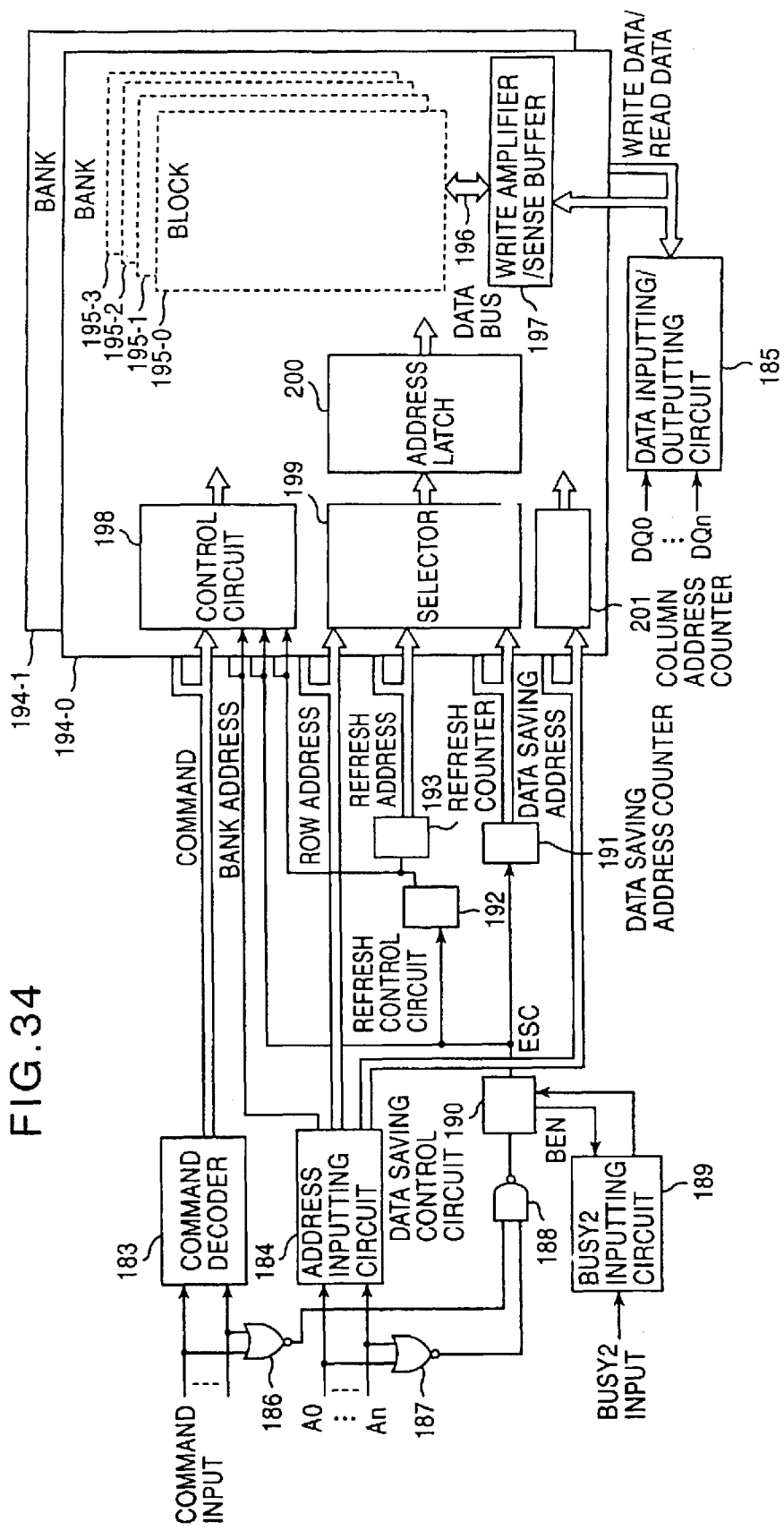
FIG. 34 is a circuit diagram showing an essential portion of a fourth embodiment of a semiconductor memory device according to the present invention.
Figure 35:
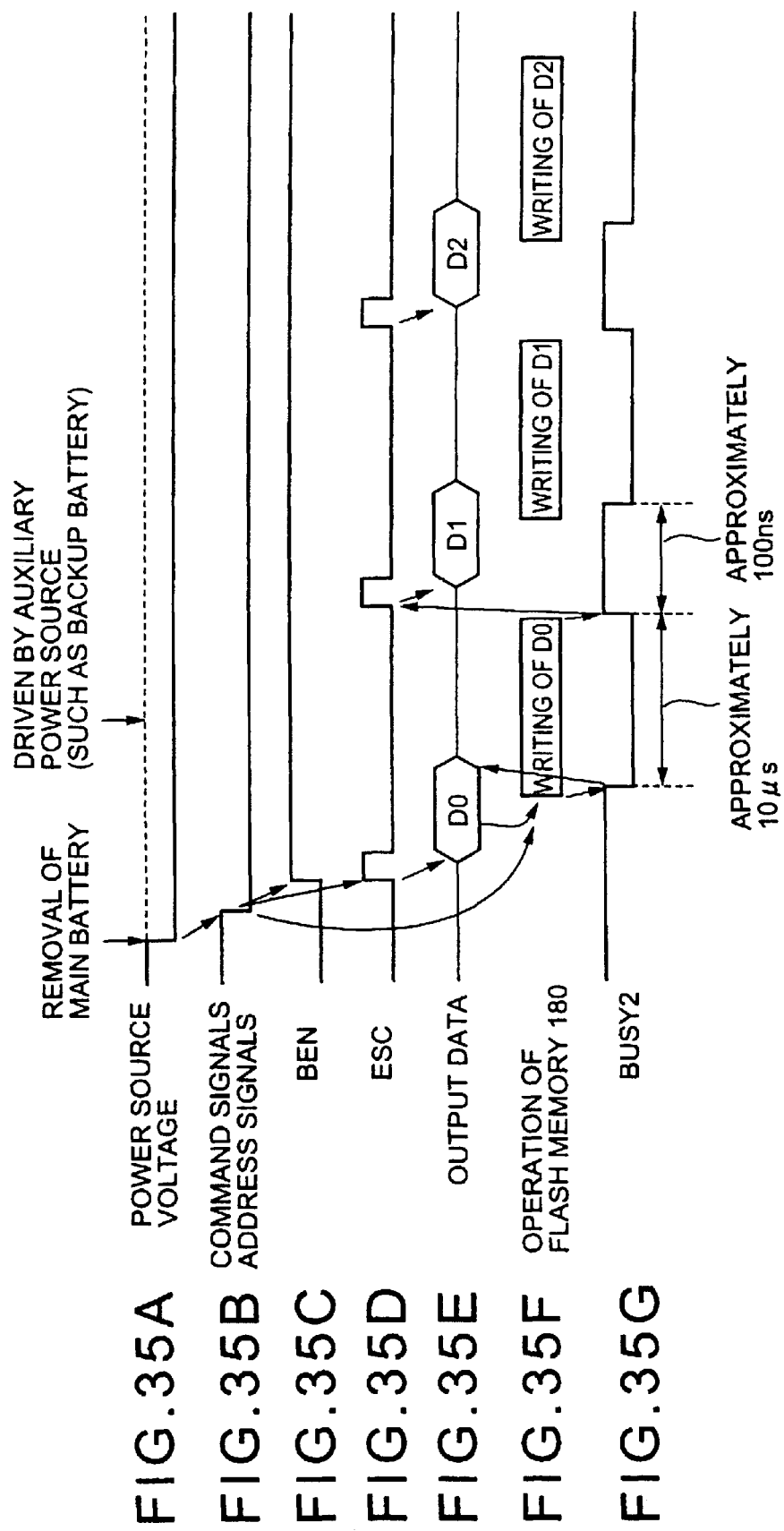
FIGS. 35A through 35G show waveforms illustrating an example of operations in a case where the fourth embodiment of the semiconductor memory device according to the present invention is applied to a DRAM of the electronic apparatus shown in FIG. 33.

FIG. 34 is a circuit diagram showing an essential portion of a fourth embodiment of a semiconductor memory device according to the present invention. This semiconductor memory device can be used as the DRAM 178 included in the fourth embodiment of the electronic apparatus according to the present invention shown in FIG. 33.

In FIG. 34, a command decoder 183 decodes command signals from the controller 179, an address inputting circuit 184 inputs thereto address signals A0 through An, and a data inputting/outputting circuit 185 performs inputting/outputting of read/write data DQ0 through DQn.

Further, a NOR circuit 186 processes, in accordance with the NOR manner, the command signals from the controller 179, a NOR circuit 187 processes, in accordance with the NOR manner, the address signals A0 through An and a NAND circuit 188 processes, in accordance with the NAND manner, the respective outputs of the NOR circuits 186 and 187.

The output of the NOR circuit 186 has the H level only when all the command signals have the L level, and the output of the NOR circuit 187 has the H level only when all the address signals A0 through An have the L level. Therefore, the output of the NAND circuit 188 has the L level only when all the command signals and address signals A0 through An have the L level. In this case, this semiconductor memory device automatically enters a data saving mode.

Further, a BUSY2 inputting buffer 189 is used for receiving the busy signal BUSY2 from the flash memory 180, a data saving control circuit 190 controls saving of data. The data saving control circuit 190 outputs a busy enable signal BEN for activating the BUSY2 inputting buffer 189, and, also, outputs a data saving control signal ESC, when the output of the NAND circuit 188 has the L level, that is, when all the command signals and address signals A0 through An from the controller 179 have the L level. Then, the data saving control circuit 190 outputs the data saving control signal ESC each time the BUSY2 inputting buffer 189 inputs the busy signal BUSY2 thereto.

Further, a data saving address counter 191 receives the data saving control signal ESC and outputs the addresses from which the data to be saved is read, a refresh control circuit 192 receives the data saving control signal ESC and outputs a refresh control signal REF, and a refresh counter 193 uses the refresh control signal REF as a trigger signal and outputs the refresh addresses.

Further, banks 194-0 and 194-1 are selected by a bank address signal. The banks 194-0 and 194-1 have the same circuit arrangement. In the bank 194-0, blocks 195-0 through 195-3 have the arrangements same as those of the blocks 12-0 through 12-3 shown in FIG. 3.

Further, a bus 196 is provided for the blocks 195-0 through 195-3 in common, a write amplifier/sense buffer 197 is provided for the blocks 195-0 through 195-3 in common, and a control circuit 198 controls the operation of the bank 194-0.

Further, a selector 199 is controlled by the control circuit 198 and selects the row address output from the address inputting circuit 184 when read/write operation is performed in the semiconductor memory device, selects the refresh address output from the refresh counter 193 when the refresh of the semiconductor memory device is performed, selects the data saving address output from the data saving address counter 191 when the data is saved in the flash memory 180. An address latch circuit 200 holds and outputs the address signals output from the selector 199. A column address counter 201 is also provided.

FIGS. 35A through 35G show waveforms illustrating an example of operations in a case where the fourth embodiment of the semiconductor memory device according to the present invention is applied to the DRAM 178 of the electronic apparatus shown in FIG. 33. FIG. 35A shows a power supply voltage supplied by the main battery, FIG. 35B shows command signals and address signals output from the controller, FIG. 35C shows the busy enable signal BEN, FIG. 35D shows the data saving signal ESC, FIG. 35E shows output data, FIG. 35F shows the operation state of the flash memory 180 and FIG. 35G shows the busy signal BUSY2.

In the electronic apparatus shown in FIG. 33, when the power supply from the main battery is stopped, all the command signals and address signals output from the controller 179 come to have the L level, and, in the fourth embodiment of the semiconductor memory device according to the present invention, the output of the NAND circuit 188 comes to have the L level. Thereby, the busy enable signal BEN comes to have the H level, the BUSY2 inputting circuit 189 is activated, and, also, the first data saving control signal ESC is output and this semiconductor memory device enters the data saving mode. Then, the data D0 to be saved is output from the semiconductor memory device and is written to the flash memory 180. During this time, the busy signal BUSY2 comes to have the L level, and indicates that data is being written to the flash memory 180. During the time during which the busy signal BUSY2 has the L level, the data saving control signal ESC is stopped, and the refresh of this semiconductor memory device is restarted.

Then, when writing of the data D0 to be saved is completed in the flash memory 180, the busy signal BUSY2 comes to have the H level and is provided to the data saving control circuit 190 via the BUSY inputting circuit 189. Then, the second data saving control signal ESC is output. In response thereto, the second data D1 to be saved is output, and is written to the flash memory 180. During this time, the busy signal BUSY2 comes to have the L level, and indicates that the data is being written to the flash memory 180. During the time during which the busy signal BUSY2 has the L level, the data saving control signal ESC is stopped, and the refresh of this semiconductor memory device is restarted.

Then, when writing of the data D1 to be saved is completed in the flash memory 180, the busy signal BUSY2 comes to have the H level and is provided to the data saving control circuit 190 via the BUSY inputting circuit 189. Then, the third data saving control signal ESC is output. In response thereto, the third data D2 to be saved is output, and is written to the flash memory 180. During this time, the busy signal BUSY2 comes to have the L level, and indicates that the data is being written to the flash memory 180. Then, the same operations are repeated until all the data to be saved is output and written to the flash memory 180.

Thus, by applying the fourth embodiment of the semiconductor memory device according to the present invention to the DRAM 178 shown in FIG. 33, it is possible to save the data stored in this semiconductor memory device in the flash memory 180 which does not need to be refreshed, when the main battery goes dead, or is removed, and, thereby, the power supply by the main battery is stopped.

Accordingly, when the fourth embodiment of the semiconductor memory device according to the present invention is applied to a simple terminal such as a cellular phone in which a DRAM is mounted, power consumption of a backup battery due to the refresh of the DRAM 178 can be reduced as much as possible, when a main battery goes dead, or is removed, and, thereby, power supply by the main battery is stopped.

Figure 36:
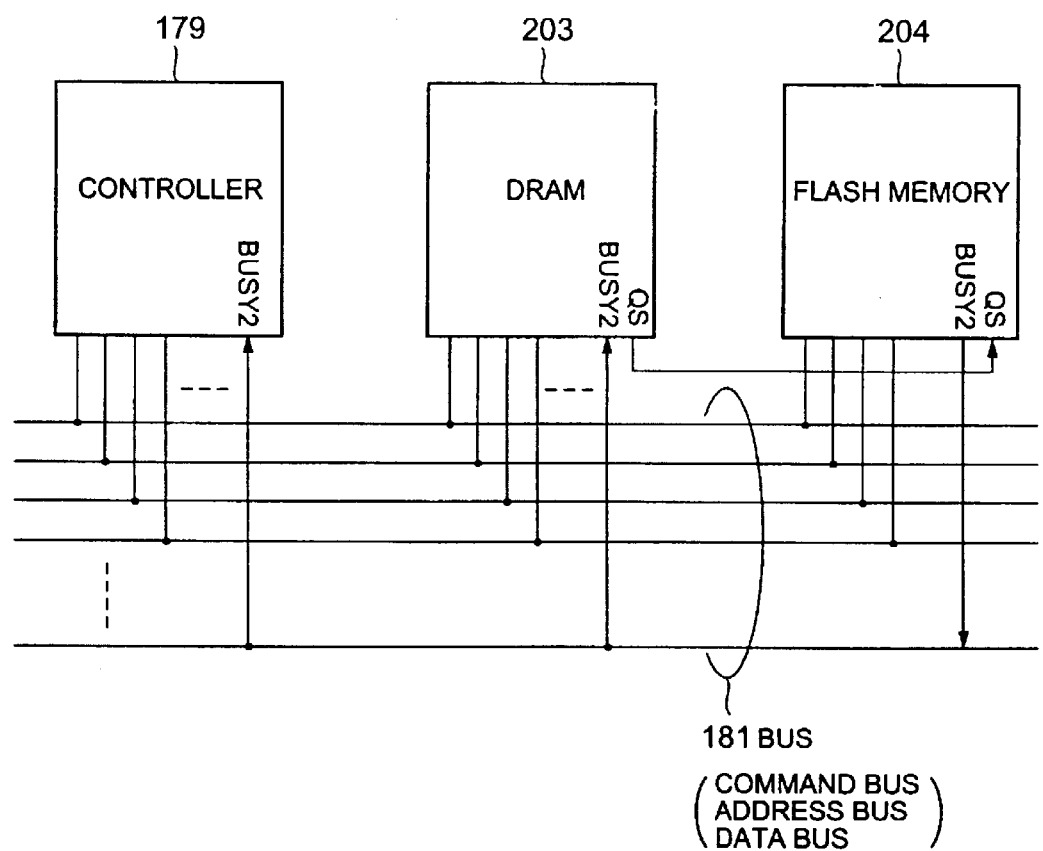
FIG. 36 is a circuit diagram showing an essential portion of a fifth embodiment of an electronic apparatus according to the present invention.

FIG. 36 is a circuit diagram showing an essential portion of a fifth embodiment of an electronic apparatus according to the present invention. The fifth embodiment of the electronic apparatus according to the present invention is provided with a DRAM 203 and a flash memory 204 having circuit arrangements different from the DRAM 178 and flash memory 180 which the fourth embodiment of the electronic apparatus according to the present invention shown in FIG. 33 is provided with. Except therefor, the fifth embodiment of the electronic apparatus according to the present invention has the same arrangement as that of the fourth embodiment of the electronic apparatus according to the present invention shown in FIG. 33.

The DRAM 203 is configured to output data and also a data strobe signal QS which indicates timing in which the output data is to be brought in. The flash memory 204 is configured to receive the data strobe signal QS from the DRAM 203, and can bring therein the output data from the DRAM 203 in the timing indicated by the data strobe signal QS.

Thus, from the fifth embodiment of the electronic apparatus according to the present invention, advantages similar to those obtained from the fourth embodiment of the electronic apparatus according to the present invention shown in FIG. 33 can be obtained, and, also, control of bringing in of data from the DRAM 203 can be performed easily.

Figure 37:
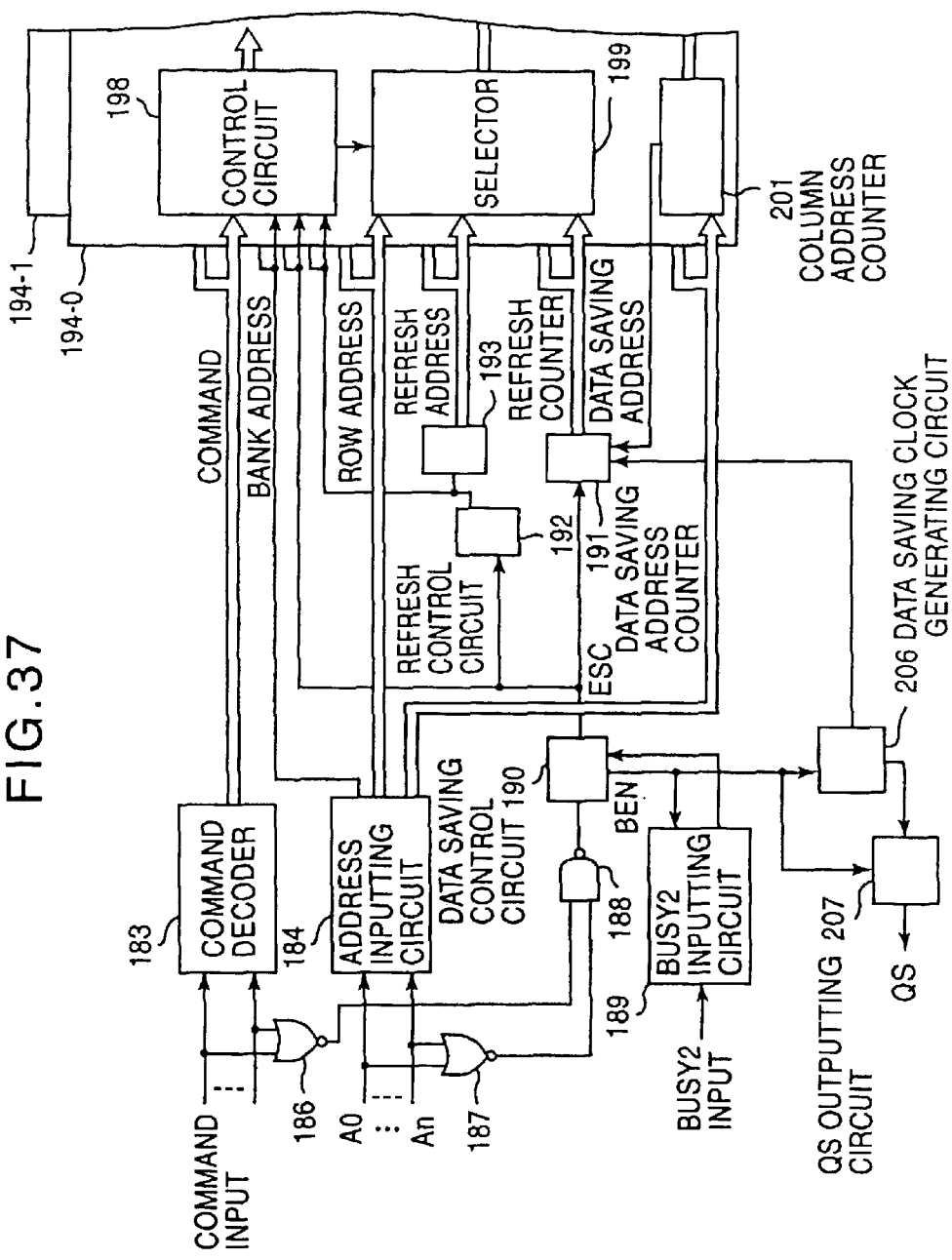
FIG. 37 is a circuit diagram showing an essential portion of a fifth embodiment of a semiconductor memory device according to the present invention.
Figure 38:
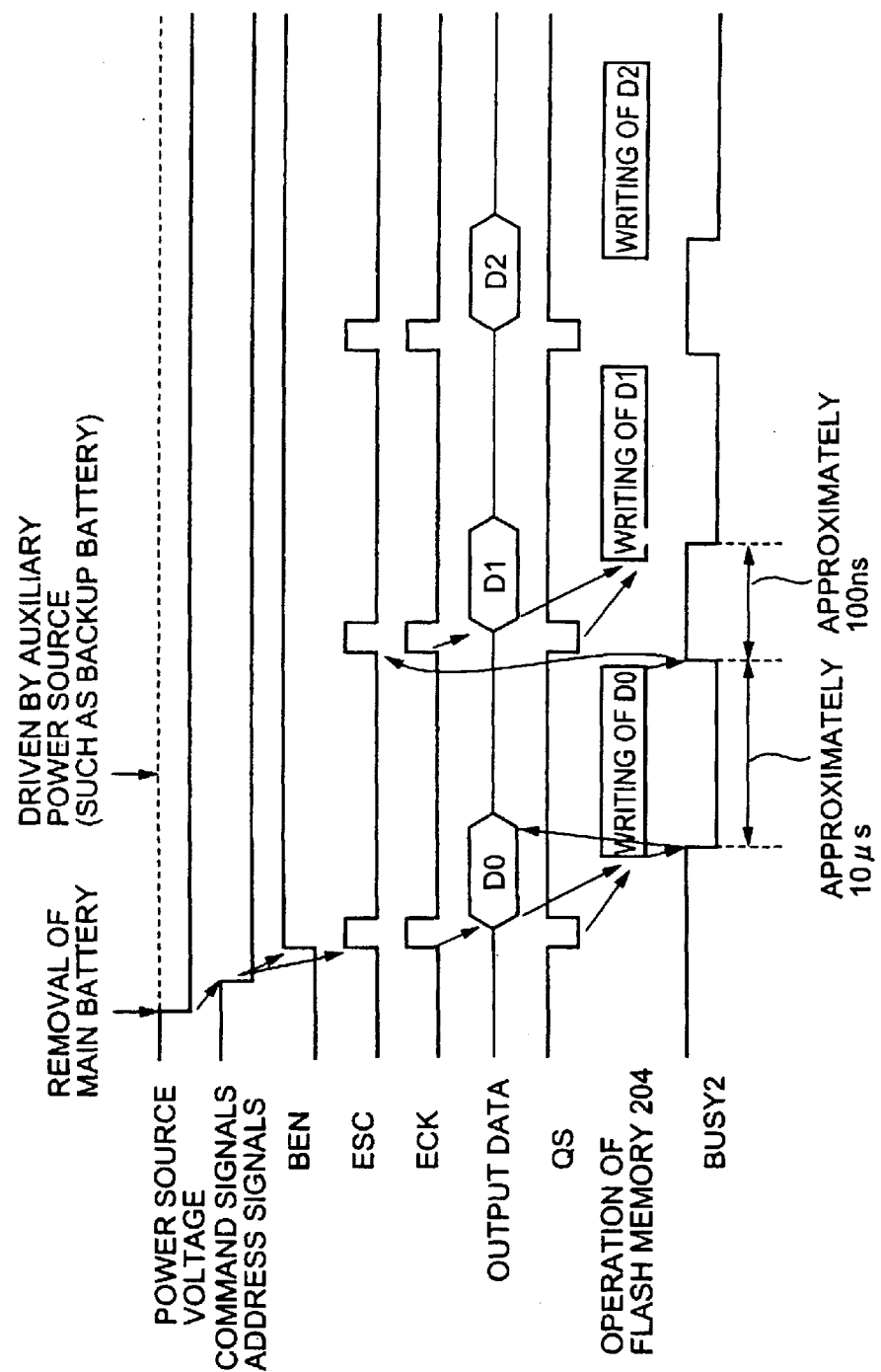
FIGS. 38A through 38I show waveforms illustrating an example of operations in a case where the fifth embodiment of the semiconductor memory device according to the present invention is applied to a DRAM of the electronic apparatus shown in FIG. 36.

FIG. 37 is a circuit diagram showing an essential portion of a fifth embodiment of a semiconductor memory device according to the present invention. The fifth embodiment of the semiconductor memory device according to the present invention can be used as the DRAM 203 which the fifth embodiment of the electronic apparatus according to the present invention shown in FIG. 36 is provided with.

The fifth embodiment of the semiconductor memory device according to the present invention is provided with a data saving clock signal generating circuit 206 which generates a data saving clock signal (clock signal for the data saving operation) and a QS outputting circuit 207 which generates the data strobe signal QS. When the data saving operation is performed, the data saving clock signal is output from the data saving clock signal generating circuit 206, then, the data saving address counter 191, QS outputting circuit 207 and so forth are operated in synchronization with the data saving clock signal, so that the output timing of the data strobe signal QS and the output data becomes the proper one. Except therefor, the fifth embodiment of the semiconductor memory device according to the present invention has the same arrangement as that of the fourth embodiment of the semiconductor memory device according to the present invention shown in FIG. 34.

The data saving clock signal generating circuit 206 may have an oscillator built therein for generating the data saving clock signal. Alternatively, the data saving clock signal generating circuit 206 may use a clock signal from a crystal oscillator or the like which an electronic apparatus using the fifth embodiment of the semiconductor memory device according to the present invention is provided with for generating the data saving clock signal.

FIGS. 38A through 38I show waveforms illustrating an example of operations in a case where the fifth embodiment of the semiconductor memory device according to the present invention is applied to the DRAM 203 of the electronic apparatus shown in FIG. 36. FIG. 38A shows a power supply voltage supplied by the main battery, FIG. 38B shows command signals and address signals output from the controller, FIG. 38C shows the busy enable signal BEN, FIG. 38D shows the data saving signal ESC, FIG. 38E shows the data saving clock signal ECK output from the data saving clock signal generating circuit 206, FIG. 35F shows output data, FIG. 35G shows the data strobe signal QS, FIG. 35H shows the operation state of the flash memory 204 and FIG. 35I shows the busy signal BUSY2.

In the electronic apparatus shown in FIG. 36, when the power supply from the main battery is stopped, all the command signals and address signals output from the controller 179 come to have the L level, and, in the fifth embodiment of the semiconductor memory device according to the present invention, the output of the NAND circuit 188 comes to have the L level. Thereby, the busy enable signal BEN comes to have the H level, the BUSY2 inputting circuit 189 and data saving clock signal generating circuit 206 are activated, and, also, the first data saving control signal ESC is output and this semiconductor memory device enters the data saving mode. Then, the data D0 to be saved is output from the semiconductor memory device, and, also the data strobe signal QS is output. Then, the data D0 is written to the flash memory 204. During this time, the busy signal BUSY2 comes to have the L level, and indicates that data is being written to the flash memory 204. During the time during which the busy signal BUSY2 has the L level, the data saving control signal ESC is stopped, and the refresh of this semiconductor memory device is restarted.

Then, when writing of the data D0 to be saved is completed in the flash memory 204, the busy signal BUSY2 comes to have the H level and is provided to the data saving control circuit 190 via the BUSY inputting circuit 189. Then, the second data saving control signal ESC is output. In response thereto, the second data D1 to be saved is output, and, also the data strobe signal QS is output. Then, the data D1 is written to the flash memory 204. During this time, the busy signal BUSY2 comes to have the L level, and indicates that the data is being written to the flash memory 204. During the time during which the busy signal BUSY2 has the L level, the data saving control signal ESC is stopped, and the refresh of this semiconductor memory device is restarted.

Then, when writing of the data D1 to be saved is completed in the flash memory 204, the busy signal BUSY2 comes to have the H level and is provided to the data saving control circuit 190 via the BUSY inputting circuit 189. Then, the third data saving control signal ESC is output. In response thereto, the third data D2 to be saved is output, and, also the data strobe signal QS is output. Then, the data D2, and is written to the flash memory 204. During this time, the busy signal BUSY2 comes to have the L level, and indicates that the data is being written to the flash memory 204. Then, the same operations are repeated until all the data to be saved is output and written to the flash memory 204.

Thus, from the fifth embodiment of the semiconductor memory device according to the present invention, when this semiconductor memory device is applied to the DRAM 203 shown in FIG. 36, advantages similar to those obtained from the fourth embodiment of the semiconductor memory device according to the present invention shown in FIG. 34 can be obtained, and, also, control of bringing in of data by the flash memory 204 can be performed easily.

Figure 39:
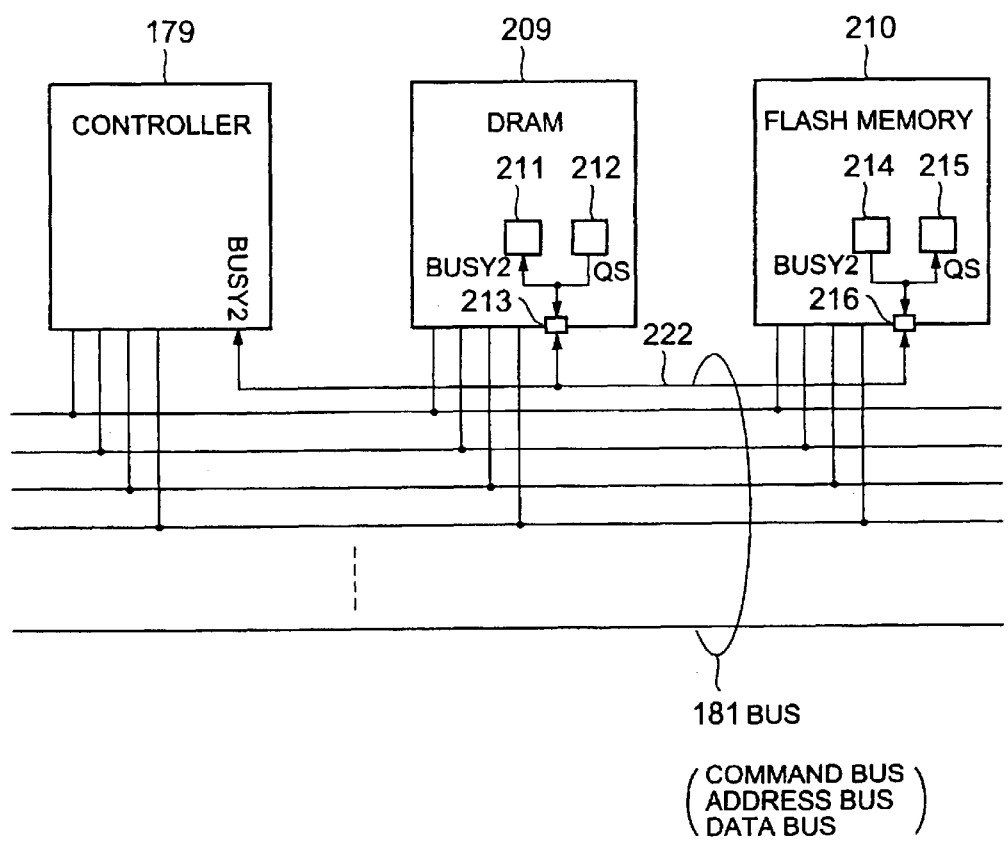
FIG. 39 is a circuit diagram showing an essential portion of a sixth embodiment of an electronic apparatus according to the present invention.

FIG. 39 is a circuit diagram showing an essential portion of a sixth embodiment of an electronic apparatus according to the present invention. The sixth embodiment of the electronic apparatus according to the present invention is provided with a DRAM 209 and a flash memory 210 having circuit arrangements different from the DRAM 178 and flash memory 180 which the fourth embodiment of the electronic apparatus according to the present invention shown in FIG. 33 is provided with. Except therefor, the sixth embodiment of the electronic apparatus according to the present invention has the same arrangement as that of the fourth embodiment of the electronic apparatus according to the present invention shown in FIG. 33.

The DRAM 209 has a BUSY2 inputting circuit 211 for inputting the busy signal BUSY2 and a QS outputting circuit 212 for outputting the data strobe signal QS built therein, and is provided with an external terminal 213 which is used both as a busy signal inputting terminal and as a data strobe signal outputting terminal.

The flash memory 210 has a BUSY2 outputting circuit 214 for outputting the busy signal BUSY2 and a QS inputting circuit 215 for inputting the data strobe signal QS built therein, and is provided with an external terminal 216 which is used both as a busy signal outputting terminal and as a data strobe signal inputting terminal.

Figure 40:
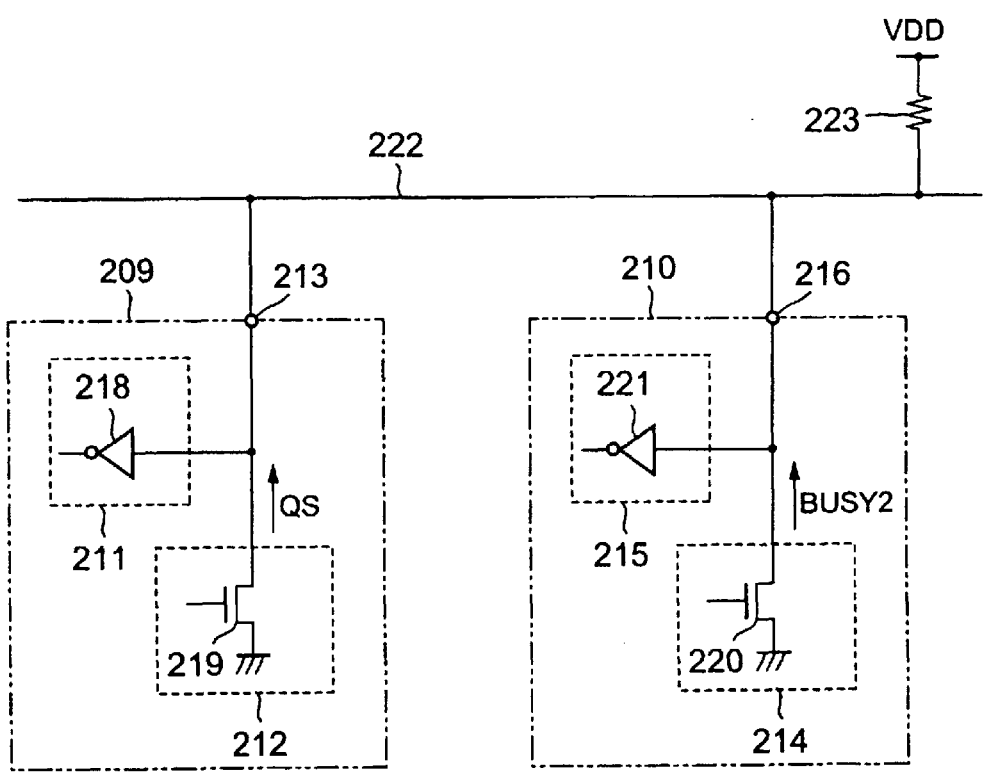
FIG. 40 is a circuit diagram showing an example of arrangements of a BUSY2 inputting circuit, a QS outputting circuit, a BUSY2 outputting circuit and a QS inputting circuit shown in FIG. 39.

FIG. 40 is a circuit diagram showing an example of arrangements of the BUSY2 inputting circuit 211, QS outputting circuit 212, BUSY2 outputting circuit 214 and QS inputting circuit 215. In FIG. 40, in the BUSY2 inputting circuit 211, an inverter 218 is used for inputting the busy signal BUSY2, and, in the QS outputting circuit 212, an NMOS transistor 219 is used for outputting the data strobe signal QS.

In the BUSY2 outputting circuit 214, an NMOS transistor 220 is used for outputting the busy signal BUSY2, and, in the QS inputting circuit 215, an inverter 221 is used for inputting the data strobe signal QS.

In this case, because the QS outputting circuit 212 and BUSY2 outputting circuit 214 have the open-drain outputting form, a high-resistance resistor 223 is needed to be provided between the BUSY2/QS common line 222 and the power-source voltage line VDD, in order to keep the signal levels of the busy signal BUSY2 and data strobe signal QS in the proper levels, respectively.

From the sixth embodiment of the electronic apparatus according to the present invention configured as described above, the same advantages as those obtained from the fourth embodiment of the electronic apparatus according to the present invention shown in FIG. 33 can be obtained, and, also, control of bringing in of data from the DRAM 209 can be performed easily. Also, it is possible to reduce the number of external terminals of the DRAM 209 and flash memory 210.

Figure 41:
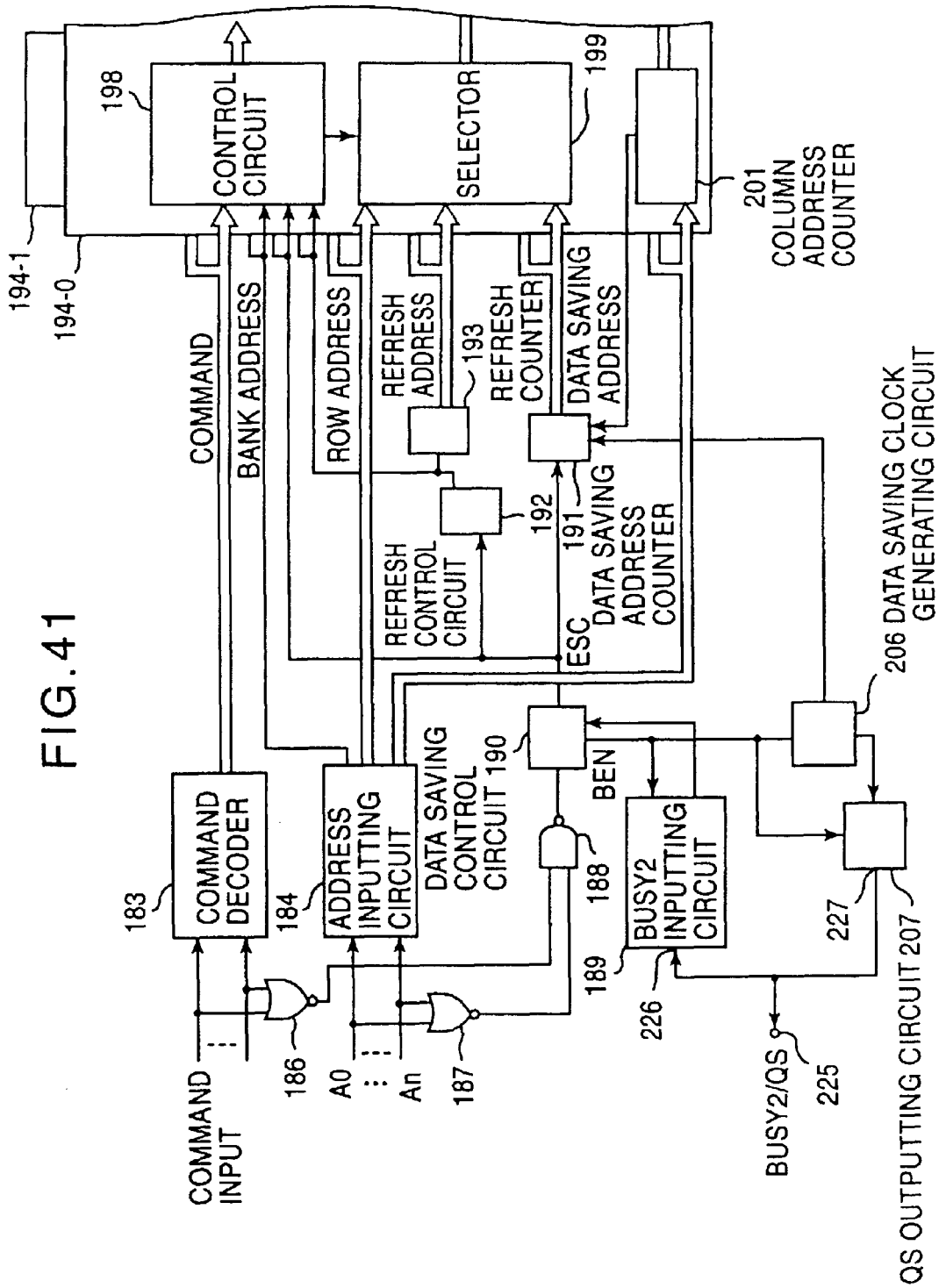
FIG. 41 is a circuit diagram showing an essential portion of a sixth embodiment of a semiconductor memory device according to the present invention.
Figure 42:
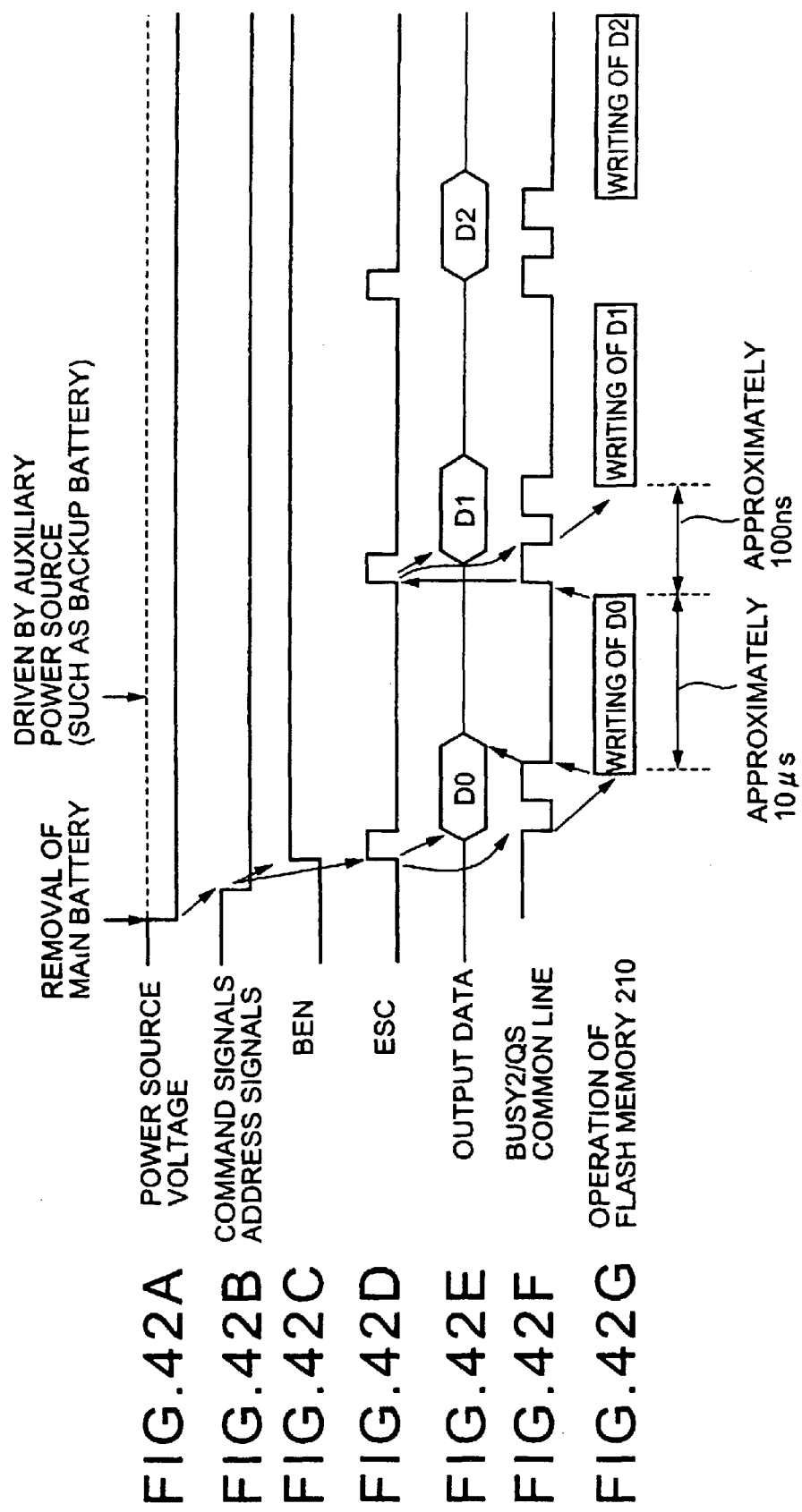
FIGS. 42A through 42G show waveforms illustrating an example of operations in a case where the sixth embodiment of the semiconductor memory device according to the present invention is applied to a DRAM of the electronic apparatus shown in FIG. 39.
Figure 43:
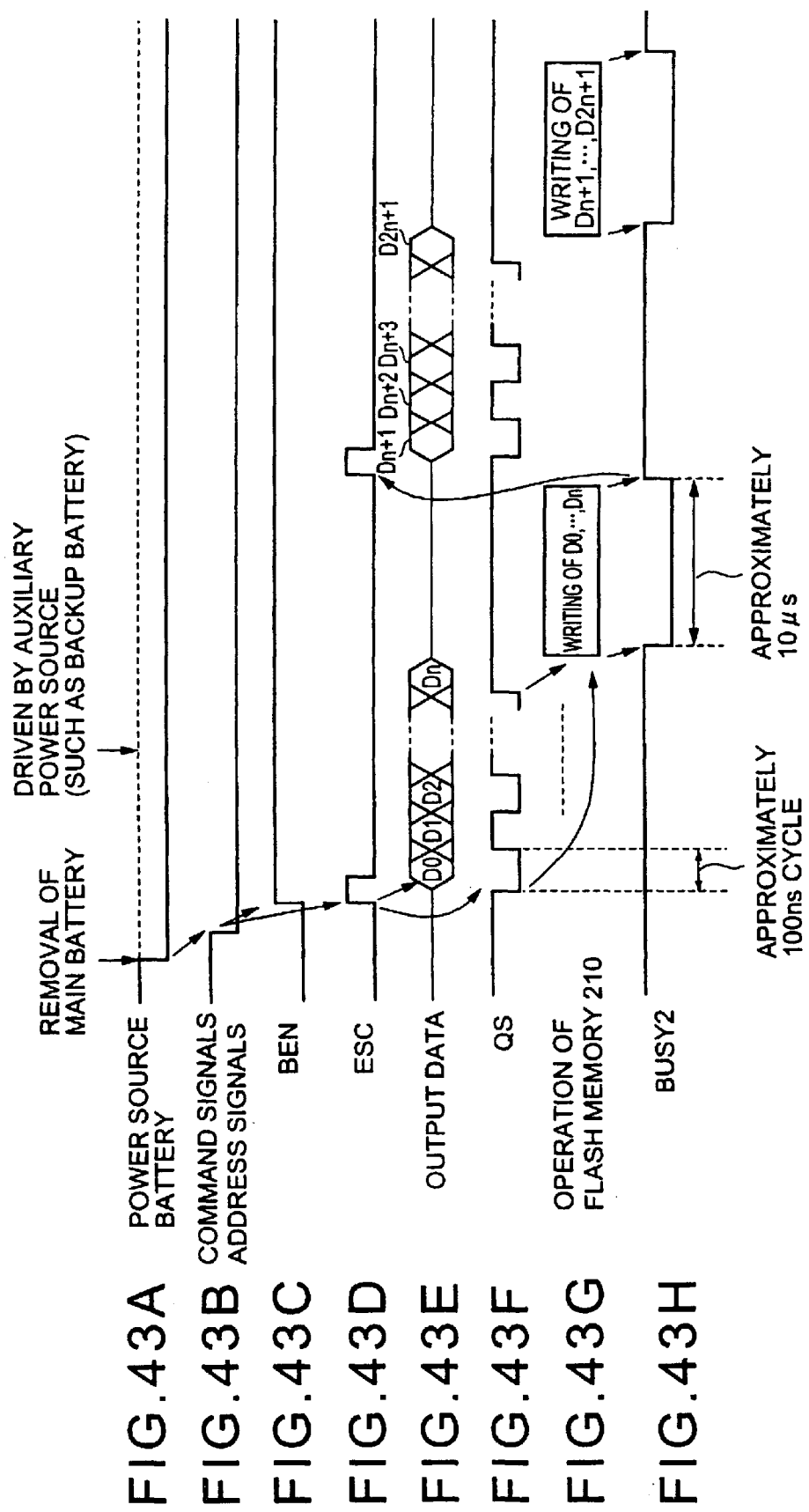
FIGS. 43A through 43H show waveforms illustrating another example of operations in the case where the sixth embodiment of the semiconductor memory device according to the present invention is applied to the DRAM of the electronic apparatus shown in FIG. 39.

FIG. 41 is a circuit diagram showing an essential portion of a sixth embodiment of a semiconductor memory device according to the present invention. The sixth embodiment of the semiconductor memory device according to the present invention can be used as the DRAM 209 which the sixth embodiment of the electronic apparatus according to the present invention shown in FIG. 39 is provided with.

The sixth embodiment of the semiconductor memory device according to the present invention is provided with an external terminal 225 which is used both as a busy signal inputting terminal and as a data strobe signal outputting terminal. The external terminal 225 is connected with the input terminal 226 of the BUSY2 inputting circuit 189 and with the output terminal of the QS outputting circuit 207. Except therefor, the sixth embodiment of the semiconductor memory device according to the present invention has the same arrangement as that of the fifth embodiment of the semiconductor memory device according to the present invention shown in FIG. 37.

FIGS. 42A through 42G show waveforms illustrating an example of operations in a case where the sixth embodiment of the semiconductor memory device according to the present invention is applied to the DRAM 209 of the electronic apparatus shown in FIG. 39. FIG. 42A shows a power supply voltage supplied by a main battery, FIG. 42B shows the state of command signals and address signals output from the controller, FIG. 42C shows the busy enable signal BEN, FIG. 42D shows the data saving signal ESC, FIG. 42E shows output data, FIG. 42F shows the electric potential of the BUSY2/QS common line and FIG. 42G shows the state of the flash memory 210.

In the electronic apparatus shown in FIG. 39, when the power supply from the main battery is stopped, all the command signals and address signals output from the controller 179 come to have the L level, and, in the sixth embodiment of the semiconductor memory device according to the present invention, the output of the NAND circuit 188 comes to have the L level. Thereby, the busy enable signal BEN comes to have the H level, the BUSY2 inputting circuit 189 is activated, and, also, the first data saving control signal ESC is output and this semiconductor memory device enters the data saving mode. Then, the first data D0 to be saved is output from the semiconductor memory device, also the data strobe signal QS having the L level is output to the BUSY2/QS common line, the data D0 to be saved is brought in by the flash memory 210 in synchronization with the data strobe signal QS and is written to the flash memory 210. During this time, the busy signal BUSY2 having the L level is output to the BUSY2/QS common line, and, thus, it is indicated that data is being written to the flash memory 210.

Then, when writing of the data D0 to be saved is completed in the flash memory 210, the signal on the BUSY2/QS common line comes to have the H level, and is provided to the data saving control circuit 190 via the BUSY inputting circuit 189. Then, the second data saving control signal ESC is output. In response thereto, the second data D1 to be saved is output from the semiconductor memory device, also the data strobe signal QS having the L level is output to the BUSY2/QS common line, the data D1 to be saved is brought in by the flash memory 210 in synchronization with the data strobe signal QS and is written to the flash memory 210. During this time, the busy signal BUSY2 having the L level is output to the BUSY2/QS common line, and, thus, it is indicated that data is being written to the flash memory 210.

Then, when writing of the data D1 to be saved is completed in the flash memory 210, the signal on the BUSY2/QS common line comes to have the H level, and is provided to the data saving control circuit 190 via the BUSY inputting circuit 189. Then, the third data saving control signal ESC is output. In response thereto, the third data D2 to be saved is output from the semiconductor memory device, also the data strobe signal QS having the L level is output to the BUSY2/QS common line, the data D2 to be saved is brought in by the flash memory 210 in synchronization with the data strobe signal QS and is written to the flash memory 210. During this time, the busy signal BUSY2 having the L level is output to the BUSY2/QS common line, and, thus, it is indicated that data is being written to the flash memory 210.

Thus, from the sixth embodiment of the semiconductor memory device according to the present invention, when this semiconductor memory device is applied to the DRAM 209 shown in FIG. 39, the same advantages as those obtained from the fifth embodiment of the semiconductor memory device according to the present invention shown in FIG. 37 can be obtained. Also, it is possible to reduce the number of external terminals. Further, as shown in FIGS. 43A through 43H, data to be saved consisting of a plurality of bytes may be output all together in a burst mode. FIG. 43A shows the power supply voltage supplied by the main battery, FIG. 43B shows the state of command signals and address signals output from the controller, FIG. 43C shows the busy enable signal BEN, FIG. 43D shows the data saving signal ESC, FIG. 43E shows output data, FIG. 43F shows the data strobe signal QS, FIG. 43G shows the state of the flash memory 210 and FIG. 43H shows the busy signal BUSY2.

Figure 44:
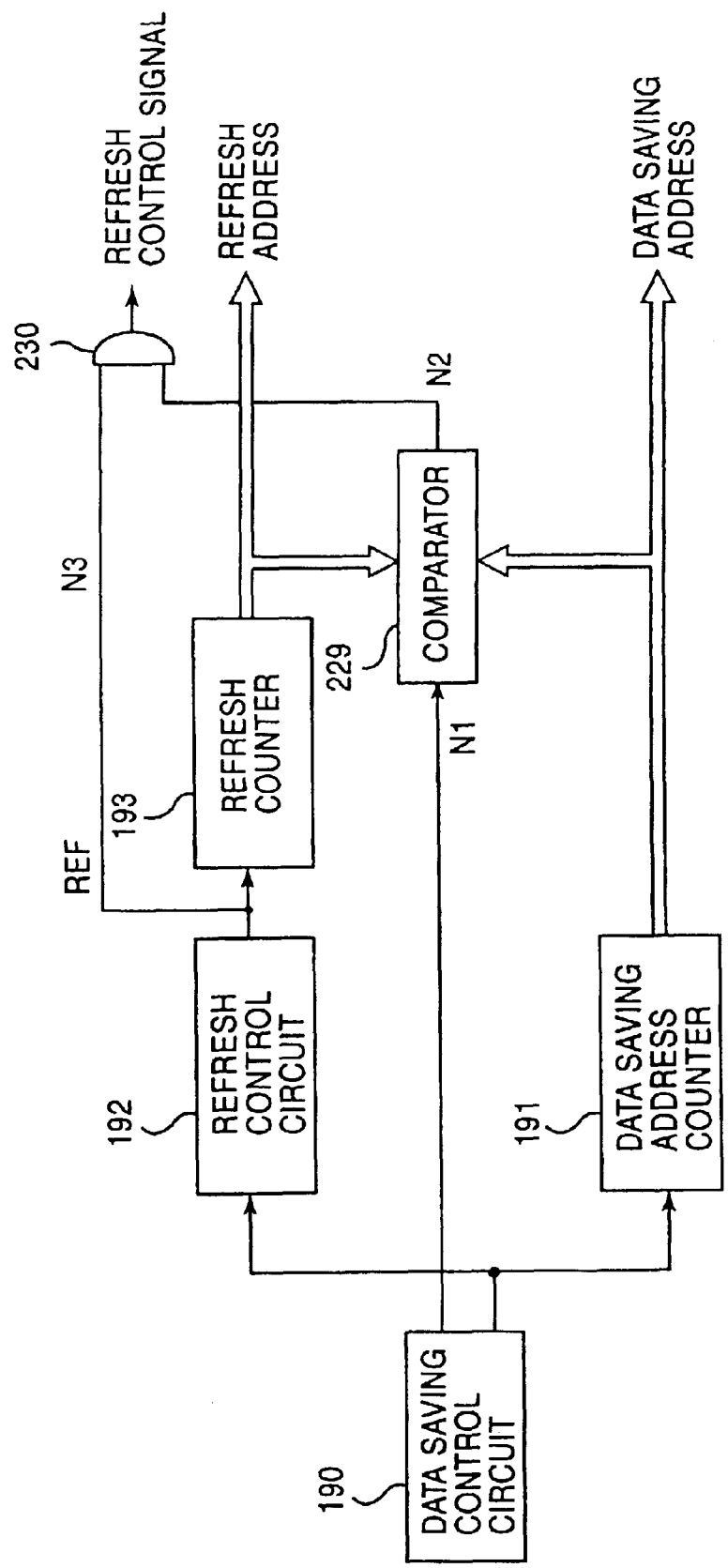
FIG. 44 is a circuit diagram showing an essential portion of a seventh embodiment of a semiconductor memory device according to the present invention.

FIG. 44 is a circuit diagram showing an essential portion of a seventh embodiment of a semiconductor memory device according to the present invention. This semiconductor memory device can be used as the DRAM 203 shown in FIG. 36.

The seventh embodiment of the semiconductor memory device according to the present invention is provided with a comparator 229 which compares the data saving address output from the data saving address counter 191 with the refresh address output from the refresh counter 193, and an AND circuit 230 which uses the output N2 of the comparator 229 as a gate signal therefor and controls transmission of the refresh control signal REF output from the refresh control circuit 192. Except therefor, this semiconductor memory device has the same arrangement as that of the fifth embodiment of the semiconductor memory device according to the present invention shown in FIG. 37.

The comparator 229 is controlled by a control signal N1 output from the data saving control circuit 190 and performs the comparison operation when the control signal N1 has the H level. The control signal N1 has the H level in the data saving mode, but has the L level in all the other cases. The output N2 of the comparator 229 has the H level only when the refresh address is larger than the data saving address, but has the L level in all the other cases.

When the data stored in this semiconductor memory device is saved in the flash memory 204, and the output N2 of the comparator 229 has the H level, that is, the output refresh address is greater than the output data saving address and the data at the output refresh address has not been saved, the refresh control signal REF is output. Thereby, the refresh is performed for the output refresh address.

In contrast to the above, when the data stored in this semiconductor memory device is saved in the flash memory 204, and the output N2 of the comparator 229 has the L level, that is, the output refresh address is smaller than the output data saving address and the data at the output refresh address has been already saved, the refresh control signal REF is not output from the AND circuit 230. Thereby, the refresh is not performed for the output refresh address.

Thus, from the seventh embodiment of the semiconductor memory device according to the present invention, the same advantages as those obtained from the fifth embodiment of the semiconductor memory device according to the present invention shown in FIG. 37 can be obtained. Also, for the addresses, the data at which have been already saved, the refresh is not performed. As a result, it is possible to reduce power consumption of a backup battery to an amount smaller than that in the case of the fifth embodiment of the semiconductor memory device according to the present invention shown in FIG. 37.

Figure 45:
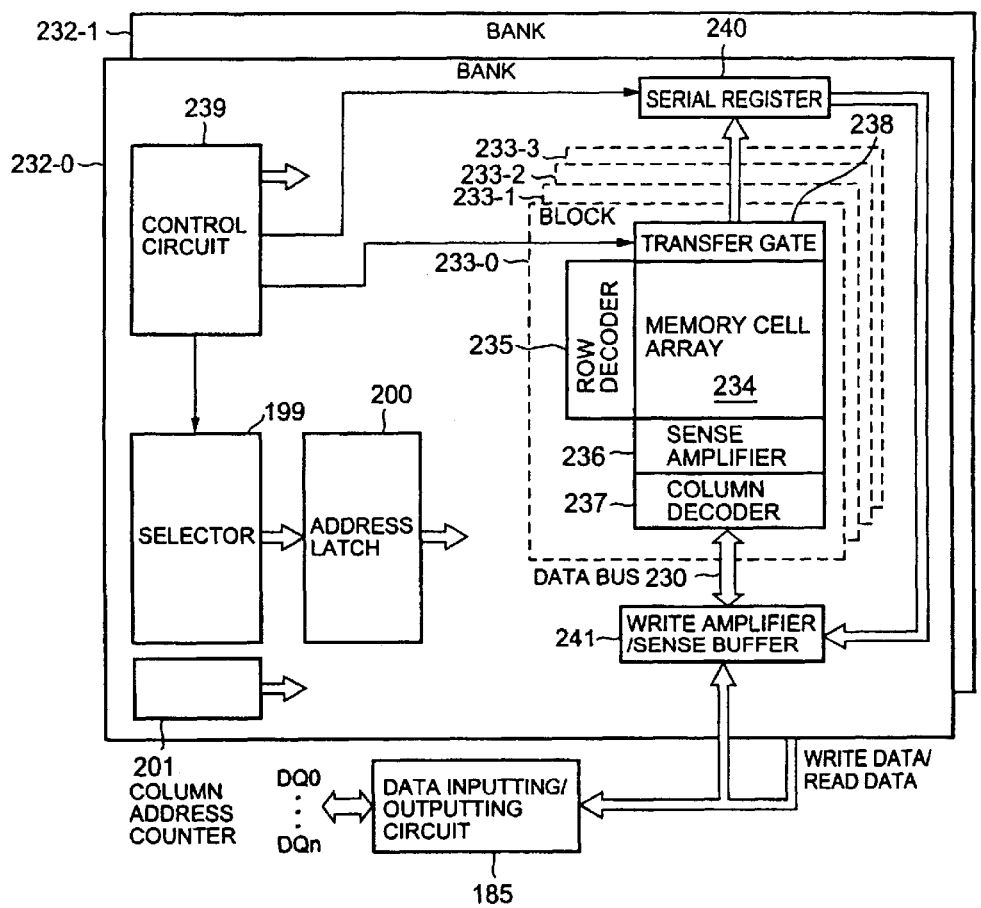
FIG. 45 is a circuit diagram showing an essential portion of a eighth embodiment of a semiconductor memory device according to the present invention.

FIG. 45 is a circuit diagram showing an essential portion of an eight embodiment of a semiconductor memory device according to the present invention. This semiconductor memory device is provided with banks 232-0 and 232-1 having circuit arrangements different from those of the banks 194-0 and 194-1 which the fourth embodiment of the semiconductor memory device according to the present invention shown in FIG. 34 is provided with. Except therefor, the eighth embodiment of the semiconductor memory device according to the present invention has the same arrangement as that of the fourth embodiment of the semiconductor memory device according to the present invention shown in FIG. 34.

The banks 232-0 and 232-1 have the same circuit arrangement. In the bank 232-0, blocks 233-0 through 233-3 are provided. The blocks 233-0 through 233-3 have the same circuit arrangement. In the block 233-0, a memory cell array 234, a row decoder 235, a sense amplifier 236, a column decoder 237, and a transfer gate 238 are provided. The transfer gate 238 is connected with a control circuit 239 and is used for transferring data read from the memory cell array 234 to a serial register which will be described later when the data stored in this semiconductor memory device is saved in a flash memory or the like.

Further, the serial register 240 is provided for the blocks 233-0 through 233-3 in common, and a write amplifier/sense buffer 241 is provided for the blocks 233-0 through 233-3 in common. The sense buffer operates so as to provide data output from the serial register 240 to the data inputting/outputting circuit 185 when the data stored in this semiconductor memory device is saved in the flash memory or the like. The other portions of the banks 232-0 and 232-1 have the same arrangements as those of the banks 194-0 and 194-1 shown in FIG. 34.

That is, in the eighth embodiment of the semiconductor memory device according to the present invention, data to be saved is stored in the serial register 240 for each row, and the data to be saved thus stored in the serial register is output from this semiconductor memory device via the sense buffer and data inputting/outputting circuit 185.

In the eighth embodiment of the semiconductor memory device according to the present invention configured as described above, the refresh operation can be performed while data is being output to be saved. Accordingly, it is possible to achieve high-efficiency operations.

Further, the present invention is not limited to the above-described embodiments, and variations and modifications may be made without departing from the scope of the present invention.

The present application is based on Japanese priority application No. 11-163461, filed on Jun. 10, 1999, the entire contents of which are hereby incorporated by reference.

What is claimed is:

1. A semiconductor memory device, comprising an automatic reading portion which comprises:
    an address counter which generates an address for automatically reading data from said device when automatic reading is externally instructed to perform; and
    an access-accepting allowing/rejecting signal receiving portion which receives an access-accepting allowing/rejecting signal output from a data transfer destination and indicating whether or not said destination agrees to accept access,
    wherein said automatic reading portion automatically reads out data from said device when the access-accepting allowing/rejecting signal indicates that said destination agrees to accept access.

2. The semiconductor memory device as claimed in claim 1, further comprising a selector which selects a first address based on an externally input address signal and transmits the thus-selected address to a decoder in the ordinary operation mode but selects a second address generated by said address counter and transmits the thus-selected address to said decoder in the automatic reading mode.

3. The semiconductor memory device as claimed in claim 2, further comprising:

memory areas in which memory cells which need to be refreshed for retaining data are arranged; and a refresh counter which generates a refresh address, wherein said selector switches between the first address and the refresh address in the ordinary operation mode, but switches the second address and the refresh address in the automatic reading mode.

4. The semiconductor memory device as claimed in claim 3, wherein the refresh operation is performed when the access-accepting allowing/rejecting signal indicates that said data transfer destination does not agree to accept access.

5. The semiconductor memory device as claimed in claim 1, further comprising a data strobe signal generating circuit, wherein, in the automatic reading mode, a data strobe signal is output together with read-out data in the automatic reading mode.

6. The semiconductor memory device as claimed in claim 5, wherein a successive predetermined plurality of data are output in synchronization with the data strobe signal.

7. The semiconductor memory device as claimed in claim 6, further comprising a clock-signal generating circuit which generates a clock signal, wherein the read-out data and the data strobe signal are output based on the clock signal.

8. The semiconductor memory device as claimed in claim 7, further comprising an oscillator built therein, wherein said clock signal generating circuit generates the clock signal based on the output of said oscillator.

9. The semiconductor memory device as claimed in claim 7, wherein said clock signal generating circuit generates the clock signal based on an external clock signal provided externally.

10. The semiconductor memory device as claimed in claim 5, wherein the data strobe signal and the access-accepting allowing/rejecting signal are input and output via a common terminal.

11. The semiconductor memory device as claimed in claim 3, further comprising a comparator which compares the second address and the refresh address, wherein the refresh operation is performed based on the comparison result of the comparator.

12. The semiconductor memory device as claimed in claim 6, further comprising:

a serial register which brings in a plurality of data and outputs them serially; and a transfer gate which causes the data stored in part of the memory cells to be transferred to said serial register, wherein, in the automatic reading mode, the data is transferred to said serial register and is output via said serial register.

13. A semiconductor memory device comprising:

an automatic writing portion which, when automatic writing is externally instructed to perform, automatically writes data to said device in internally generated addresses; and an automatic writing indicating signal outputting portion which outputs an automatic writing indicating signal, which indicates that automatic writing is being performed, during the automatic writing operation.

14. The semiconductor memory device as claimed in claim 13, further comprising a data strobe signal inputting circuit, wherein, in the automatic writing mode, said device brings in the data to be written thereto in synchronization with a data strobe signal.

15. An electronic apparatus comprising:

a first semiconductor memory device comprising an automatic reading portion which comprises:

an address counter which generates an address for automatically reading data from said device when automatic reading is externally instructed to perform; and an access-accepting allowing/rejecting signal receiving portion which receives an access-accepting allowing/rejecting signal output from a destination indicating whether or not said destination allows access, wherein said automatic reading portion automatically reads data from said device when the access-accepting allowing/rejecting signal indicates that said destination allows access; and a second semiconductor memory device comprising:

an automatic writing portion which, when automatic writing is externally instructed to perform, automatically writing data to said device in internally generated addresses; and an automatic writing indicating signal outputting portion which outputs an automatic writing indicating signal, which indicates that automatic writing is being performed, during the automatic writing operation.

* * * * *